United States Patent [19]
Kobayashi et al.

[11] Patent Number: 6,034,406
[45] Date of Patent: Mar. 7, 2000

[54] PHOTOELECTRIC CONVERSION APPARATUS HAVING A SHIELDING MEMBER BETWEEN AN ARBITRARY CONVERSION ELEMENT AND A WAVELENGTH CONVERTER

[75] Inventors: Isao Kobayashi, Atsugi; Noriyuki Kaifu, Hachiohji; Toshiaki Sato, Shizuoka; Satoshi Itabashi, Chigasaki; Tadao Endo, Atsugi; Toshio Kameshima, Sagamihara, all of Japan

[73] Assignee: Canon Kabushiki Kaisha, Tokyo, Japan

[21] Appl. No.: 08/955,815

[22] Filed: Oct. 22, 1997

[30] Foreign Application Priority Data

| Oct. 24, 1996 | [JP] | Japan | 8-282342 |
| Oct. 2, 1997 | [JP] | Japan | 9-269648 |

[51] Int. Cl.⁷ ........................ H01L 31/0232; H01L 31/00
[52] U.S. Cl. ............................ 257/435; 257/440; 257/443
[58] Field of Search ...................................... 257/435, 440, 257/443

[56] References Cited

U.S. PATENT DOCUMENTS

| 4,713,698 | 12/1987 | Takahashi et al. | 358/296 |
| 4,745,488 | 5/1988 | Kaifu et al. | 358/294 |
| 4,746,793 | 5/1988 | Hopkins, II | 250/237 R |
| 4,866,291 | 9/1989 | Shimada et al. | 250/578 |
| 4,879,470 | 11/1989 | Sugawa et al. | 250/578 |
| 4,916,304 | 4/1990 | Itabashi et al. | 250/211 R |
| 4,926,058 | 5/1990 | Iwamoto et al. | 250/578.1 |
| 4,977,096 | 12/1990 | Shimada et al. | 437/2 |
| 5,060,040 | 10/1991 | Saika et al. | 357/30 |
| 5,065,015 | 11/1991 | Horiguchi et al. | 250/237 R |
| 5,087,809 | 2/1992 | Jackson | 250/226 |
| 5,202,575 | 4/1993 | Sakai | 257/292 |
| 5,233,442 | 8/1993 | Kawai et al. | 358/482 |
| 5,272,548 | 12/1993 | Kawai et al. | 358/482 |
| 5,317,406 | 5/1994 | Kobayashi et al. | 348/307 |
| 5,335,094 | 8/1994 | Kaifu et al. | 358/494 |
| 5,723,884 | 3/1998 | Kim | 257/232 |
| 5,736,756 | 4/1998 | Wakayama et al. | 257/223 |
| 5,780,914 | 7/1998 | Kim | 257/435 |

FOREIGN PATENT DOCUMENTS

| 0605259 | 7/1994 | European Pat. Off. |
| 0660421 | 6/1995 | European Pat. Off. |

*Primary Examiner*—Ngân V. Ngô
*Attorney, Agent, or Firm*—Fitzpatrick, Cella, Harper & Scinto

[57] ABSTRACT

A photoelectric conversion apparatus comprises a plurality of photoelectric conversion elements arranged two-dimensionally on a substrate wherein the X-ray or light incidence side of some proper one or ones of the photoelectric conversion elements S13 is covered with a shielding member whose transmittance to an X-ray or light is equal to zero or substantially zero so that the photoelectric conversion elements covered with the shielding member act as correction photoelectric conversion elements thereby achieving an improvement in production yield, a reduction in cost, and a reduction in the time required to read the correction output signals, and also high performance capable of obtaining a moving picture.

56 Claims, 19 Drawing Sheets

PHOTOELECTRIC CONVERSION APPARATUS HAVING A SHIELDING MEMBER BETWEEN AN ARBITRARY CONVERSION ELEMENT AND A WAVELENGTH CONVERTER

BACKGROUND OF THE INVENTION

1. Field of the Invention

The present invention relates to a photoelectric conversion apparatus, and more particularly, to a photoelectric conversion apparatus comprising a plurality of photoelectric conversion elements arranged in an array form and having the capability of obtaining a reference signal used to perform a signal correction.

2. Description of the Related Art

Photoelectric conversion apparatuses generally have some amount of variation from apparatus to apparatus in the output obtained when the photo sensing area, in which the photoelectric conversion elements are arranged in an array form, is illuminated by light (the output in this state is referred to as the sensitivity) and also a variation in the output obtained when the photo sensing area is illuminated by no light (the output in this state is refers to as the offset output). To fully use the abilities of photoelectric conversion apparatus, it is desirable to correct such the variations. To this end, a photoelectric conversion apparatus generally has a correction circuit and a photoelectric conversion element used to generate an output signal, on the basis of which the correction is made.

Correction circuits such as an offset correction circuit and a sensitivity correction circuit are commercially available. However, a special photoelectric conversion element is required to generate correction data which is supplied to a correction circuit. That is, photoelectric conversion apparatuses generally have an offset correction photoelectric conversion element disposed separately from the main photoelectric conversion element array. More specifically, for example a CCD sensor made of crystalline silicon is disposed outside the photo sensing area of a photoelectric conversion apparatus, and the output signal obtained when there is no light illumination is monitored by the CCD sensor. The output signal obtained in this situation is used as correction data.

A sensitivity correction photoelectric conversion element is produced by placing a filter on a CCD sensor made of for example of crystalline silicon, and is disposed outside the photo sensing area as in the case of the offset correction photoelectric conversion element. The output signal obtained when detecting light with a certain illumination intensity within the range from 0 to 100% is monitored and supplied to a common correction circuit. The data actually generated by the photo sensing area of the photoelectric conversion apparatus is corrected on the basis of the above monitored signal.

However, when such a correction photoelectric conversion element is disposed on a photoelectric conversion apparatus separately from the main photoelectric conversion element array, a complicated circuit is required to read the output signal of the correction photoelectric conversion element. This causes a reduction in production yield of photoelectric conversion apparatus, thus causing an increase in production cost.

In the case of a photoelectric conversion apparatus including a plurality of pixels which are two-dimensionally arranged, if a circuit for reading the output signal of a correction photoelectric conversion element is disposed separately on the photoelectric conversion apparatus, additional time is required to read the correction output signal. As a result, it can become impossible to correct the output signal generated by the main photoelectric conversion elements in the remaining short time. This can make it difficult to take a moving picture.

SUMMARY OF THE INVENTION

It is an object of the present invention to provide means of correcting the offset output level without having to dispose a separate photoelectric conversion element for detecting an output signal used for making offset or sensitivity correction, thereby making it possible to produce, at a reduced production cost and with an improved production yield, a photoelectric conversion apparatus capable of reading a correction output signal in a short time and thus capable of easily taking a moving picture.

It is another object of the present invention to provide a photoelectric conversion apparatus including a plurality of photoelectric conversion elements arranged in a (two-dimensional) array form, and capable of correcting the variations in the outputs along rows and/or columns.

It is still another object of the present invention to provide a photoelectric conversion apparatus including a plurality of photoelectric conversion elements arranged two-dimensionally on a substrate, wherein the X-ray or light incidence side of some proper one or ones of the photoelectric conversion elements is covered with a shielding member whose transmittance to an X-ray or light is equal to zero or substantially zero.

In the photoelectric conversion apparatus according to the present invention, a photoelectric conversion element adjacent to other photoelectric conversion elements used to detect information is covered with a shielding member for blocking light carrying information so that it acts as a correction photoelectric conversion element for obtaining a correction output signal. More precise correction can be made using the output signal generated by this correction photoelectric conversion element without having to use an additional separate correction photoelectric conversion element.

In this photoelectric conversion apparatus, if a filter with a light transmittance m (0<m<100%) is placed on an arbitrary photoelectric conversion element, it is possible to make a sensitivity correction on the basis of the output signal of the photoelectric conversion element covered with the filter.

Photosensors used in the present invention will be described below.

FIGS. 1A–1C illustrate examples of photosensors, wherein FIGS. 1A and 1B illustrate two layer structures employed in a photosensor and FIG. 1C illustrates a common method of driving a photosensor. The photosensors shown in FIGS. 1A and 1B are both of the photodiode type, wherein the photosensor shown in FIG. 1A is of the pin photodiode type and that shown in FIG. 1B is of the Schottky photodiode type.

In FIGS. 1A and 1B, reference numeral 1 denotes an insulating substrate, 2 denotes a lower electrode, 3 denotes a p-type semiconductor layer (hereinafter referred to simply as a p-layer), 4 denotes an intrinsic semiconductor layer (hereinafter referred to simply as an i-layer), and 5 denotes an n-type semiconductor layer (hereinafter referred to simply as an n-layer).

In the Schottky type photodiode shown in FIG. 1B, the lower electrode 2 is made of a properly-selected material so that a Schottky barrier is formed at the boundary between the lower electrode 2 and the i-layer 4, thereby preventing injection of electrons from the lower electrode 2 to the i-layer 4.

In FIG. 1C, reference numeral 10 denotes a photosensor represented in a symbolic fashion, 11 denotes a power supply, and 12 denotes a detecting circuit such as a current amplifier. In the photosensor 10, the side denoted by symbol C corresponds to the transparent electrode 6 in FIGS. 1a and 1b, and the side denoted by symbol A corresponds to the lower electrode 2. The power supply 11 is connected to the photosensor 10 in such a manner that a positive voltage is applied to the side denoted by C while a negative voltage is applied to the side denoted by A.

The operation of the photodiode is briefly described below. If light is incident from the direction denoted by the arrow shown in FIG. 1A or 1B, and if light reaches the i-layer 4, the light is absorbed therein, and, as a result, electrons and holes are generated. Due to the electric field developed across the i-layer 4 by the voltage supplied from the power supply 11, the electrons move toward the side C, that is, they pass through the n-layer 5 and reach the transparent electrode 6, while the holes move toward the side A or the lower electrode 2. As a result, a photo current flows across the photosensor 10. When no light is incident, neither electrons nor holes are generated in the i-layer 4. The holes present in the transparent electrode 6 cannot move into the n-layer 5 because the n-layer 5 acts as a hole injection barrier. The electrons present in the lower electrode 2 cannot move into the i-layer 4 because the p-layer 3 in the case of the pin type photodiode shown in FIG. 1A or the Schottky barrier in the case of the Schottky type photodiode shown in FIG. 1B acts as an electron injection barrier. Thus, no current flows across the photosensor 10 in this case. As described above, the current varies depending on whether light is incident or not. The current is detected by the detecting circuit 12 shown in FIG. 1C, and thus the photosensor operates in a manner required as a photosensor.

To produce a photoelectric conversion apparatus capable of sensing light with a high signal-to-noise ratio using the above photosensor structure at low cost, some improvements are required as described below.

In both pin type photosensor shown in FIG. 1A and Schottky type photosensor shown in FIG. 1B, it is required to form two injection barriers at different locations. In the pin type photosensor shown in FIG. 1A, it is required that the n-layer 5 serving as an injection barrier should have both capabilities of transporting electrons to the transparent electrode 6 and preventing holes from being injected into the i-layer 4. If either capability is not good enough, a reduction in photocurrent occurs and/or a current is generated when there is no incident light (hereinafter such a current will be referred to as a dark current) or an increase in such a dark current occurs. The dark current causes a reduction in the signal-to-noise ratio. Not only is the dark current itself regarded as noise, but it also includes fluctuations called shot noise or quantum noise. Therefore, even if the dark current is canceled by performing a special process in the detecting circuit 12, it is impossible to reduce the quantum noise associated with the dark current.

To achieve better characteristics associated with the above capabilities, it is generally required to optimize the deposition conditions of the i-layer 4 and the n-layer 5 and the annealing conditions performed after forming the i-layer 4 and the n-layer 5. The p-layer 3 serving as another injection barrier should also have similar capabilities whereas electrons and holes behave in opposite manners. Thus, similar optimization of process conditions is also required for the p-layer 3. However, in general, the optimum conditions for the n-layer are not equal to the optimum conditions for the p-layer. This means that it is difficult to simultaneously achieve the optimization for both n-layer and p-layer. As can be seen from the above discussion, the above structure which requires two injection barriers at different locations in a single photosensor has difficulty in achieving a photosensor with a high signal-to-noise ratio.

The Schottky type photosensor shown in FIG. 1B has similar problems. Besides, the Schottky type photosensor shown in FIG. 1B has a further problem as described below. That is, the lower electrode 2 should be made of such a material having a proper difference in work function relative to that of the i-layer 4 so that a Schottky barrier serving as the injection barrier is formed at the boundary between the lower electrode 2 and the i-layer 4. This means that the material of the lower electrode 2 should be selected from a limited group of particular materials. Furthermore, localized states at the interface between the lower electrode 2 and the i-layer 4 can have a greater influence on the characteristics. One known technique of improving the characteristics of the Schottky barrier is to form a thin oxide or nitride of silicon or metal with a thickness of about 100 Å between the lower electrode 2 and the i-layer 4 so that holes are transported to the lower electrode 2 by means of the tunnel effect while electrons are prevented from being injected to the i-layer 4 in a more effective manner. This technique also utilizes the difference in the work function. Therefore, there is still a limitation in the material of the lower electrode 2. Furthermore, to achieve opposite properties of preventing the injection of electrons and transporting holes by means of the tunnel effect, the thickness of the oxide or nitride film is limited to very narrow range around a very small value such as 100 Å. This can cause a reduction in productivity.

This structure also needs two injection barriers at different locations. This causes poor productivity and high production cost, because if a defect occurs in either one of two injection barriers due to dust or other contamination, then the photosensor will no longer operate correctly.

Another problem in the photosensor having the above structure will be described below. FIG. 2 illustrates the layer structure of a field effect transistor made up of thin semiconductor films (referred to as a thin film transistor or a TFT). Thin film transistors are often used to form a part of controlling circuit of a photoelectric conversion apparatus. In FIG. 2, similar parts or elements to those in FIG. 1 are denoted by similar reference numerals.

In FIG. 2, reference numeral 7 denotes a gate insulating film, and 60 denotes an upper electrode. This structure can be formed as follows. A lower electrode 2 serving as a gate electrode (G), a gate insulating film 7, an i-layer 4, an n-layer 5, and an upper electrode 60 to be formed into source and drain electrodes (S, D) are sequentially formed on an insulating substrate 1. The upper electrode 60 is then etched so as to form the source and drain electrodes. Then the n-layer 5 is etched so as to form a channel. The characteristics of the thin film transistor is sensitive to the state of the interface between the gate insulating film 7 and the i-layer 4. Therefore, it is required to prevent the interface from being contaminated. To this end, all layers are generally deposited successively in the same vacuum chamber without being vented.

When the thin film transistor having the above structure and the photosensor described earlier are formed on the same substrate, the above-described layer structure of the thin film transistor can cause problems such as degradation in the characteristics or an increase in production cost. That is, although the photosensor shown in FIG. 1 has a structure consisting of either substrate/electrode/p-layer/i-layer/n-layer/electrode in the case of the pin type shown in FIG. 1A or substrate/electrode/i-layer/n-layer/electrode in the case of the Schottky type shown in FIG. 1B, the thin film transistor has a different structure consisting of substrate/electrode/insulating film/i-layer/n-layer/electrode. This means that it is impossible to simultaneously produce both the photosensor and the thin film transistor in the same production process. Thus, the production of both the photosensor and the thin film transistor on the same substrate needs a more complicated process, which results in a reduction in production yield and an increase in cost. Furthermore, if the i-layer/n-layer is used in common in both device structures, it becomes necessary to etch the gate insulating film 7 and the p-layer 3. However, this makes it impossible to form the p-layer 3, which is an important layer of the photosensor and which serves as the injection barrier, and the i-layer 4 without exposing their interface to the atmosphere. Furthermore, the etching of the gate insulating film 7 can introduce contamination at the interface between the gate insulating film 7, which is important in the thin film transistor, and the i-layer 4, which results in degradation in the characteristics and a reduction in the signal-to-noise ratio.

In the case of the improved Schottky-type photosensor having an oxide or nitride layer formed between the lower electrode 2 and the i-layer 4, the layer structure is the same in terms of the order of layers as that of the thin film transistor. However, in practice, it is difficult to use the oxide or nitride layer as the gate insulating film because the thickness of the oxide or nitride layer should be as thin as about 100 Å.

Although not shown in the figures, a capacitor used to obtain the integral of a charge or current is also needed in the photoelectric conversion apparatus. However, it is difficult to produce a capacitor having a good characteristic in terms of low leakage current, in the form in which the capacitor is incorporated into the same structure as that of the photosensor, because the capacitor needs a good insulating layer disposed between two electrodes so that the movement of electrons and holes between the two electrodes is prevented by the layer thereby making it possible to store a charge between the two electrodes, whereas the photosensor needs only semiconductor layers between two electrodes and thus it is difficult to produce a high-quality insulating layer with a low thermal leakage current using any of the semiconductor layers.

As described above, the structure of the photosensor does not well match the structures of the thin film transistor and capacitor in terms of the process and characteristics. As a result, to produce a photoelectric conversion apparatus including a great number of photosensors arranged in the form of a two-dimensional array to sequentially detect optical signals, a great number of complicated processing steps are required, and thus the production yield becomes very low. This is a serious problem in producing a high-performance multi-function apparatus.

FIG. 3 is a circuit diagram illustrating the entire circuit configuration of a photoelectric conversion apparatus which no longer has the above problems. FIG. 4 is a schematic plan view illustrating various elements included in one pixel of the photoelectric conversion apparatus. FIG. 5 is a schematic cross-sectional view taken along line A–B of FIG. 4.

In FIG. 3, reference symbols S11–S33 denote photoelectric conversion elements wherein the lower and upper electrodes thereof are denoted by G and D, respectively. C11–C33 denote storage capacitors and T11–T33 denote transfer TFTs (thin film transistors). Vs denotes a reading power supply, and Vg denotes a refreshing power supply wherein both power supplies are connected to the C electrodes of all photoelectric conversion elements via switches SWs and SWg, respectively. The switch SWs is controlled via an inverter by a refreshing control circuit RF while the switch SWg is directly controlled by the refreshing control circuit RF so that the switch SWg is turned on during each refreshing period.

Each pixel includes a photoelectric conversion element, a capacitor, and a TFT. The output signals of the respective pixels are supplied to a detection integrated circuit IC via corresponding signal lines SIG. In a photoelectric conversion apparatus which has been proposed before by the inventors of the present invention, nine pixels are divided into three groups and the output signals of three pixels of each group are simultaneously transferred to the detection integrated circuit IC via the signal lines SIG. The detection integrated circuit IC sequentially converts the received signals to an output signal (Vout). Thee pixels in each block are located in a horizontal direction and three blocks are arranged one by one in a vertical direction so that pixels are arranged in a two-dimensional array.

In FIG. 3, the part surrounded by a broken line is formed on the same insulating substrate having a large area. Of these pixels, the first pixel is schematically shown in the plan view of FIG. 4. A cross section taken along line A–B of FIG. 4 is schematically shown in FIG. 5. In FIGS. 4 and 5, reference symbol S11 denotes a photoelectric conversion element, T11 denotes a TFT, C11 denotes a capacitor, and SIG denotes a signal line. In this photoelectric conversion apparatus, no device isolation is made between the capacitor C11 and the photoelectric conversion element S11, but the capacitor C11 is formed simply by extending the electrode of the photoelectric conversion element S11. This is possible because both photoelectric conversion element and capacitor have the same layer structure.

The upper surface of the pixel is covered with an SiN passivation film and a phosphor such as CsI serving as a wavelength converter. If an X-ray is incident from above, the X-ray is converted by the phosphor CsI to light with a wavelength detectable by the photoelectric conversion element. The resultant light is incident on the photoelectric conversion element.

Referring now to FIGS. 3 and 6, an example of the operation of the photoelectric conversion apparatus will be described below. FIG. 6 is a timing chart illustrating the operation of the apparatus shown in FIG. 15.

First, shift registers SR1 and SR2 supply high-level (Hi) signals over control signal lines g1–g3 and s1–s2 thereby turning on the transfer TFTs T11–T33 and the switches M1–M3. As a result, the D electrodes of all photoelectric conversion elements S11–S33 are connected to the GND voltage (because the input terminal of the current integral amplifier Amp is designed to be maintained at the GND voltage). At the same time, a high-level signal is output from the refreshing control circuit RF. In response, the switch SWg turns on and thus the G electrodes of all photoelectric conversion elements S11–S33 are connected to a positive voltage supplied by the refreshing power supply Vg. As a result, all photoelectric conversion elements S11–S33 enter a refreshing mode and they are refreshed.

Then the refreshing control circuit RF outputs a low-level (Lo) signal so as to turn on the switch SWs so that the G electrodes of all photoelectric conversion elements S11–S33 are connected to a negative voltage generated by the reading power supply Vs. As a result, all photoelectric conversion elements S11–S33 enter a photoelectric conversion mode. At the same time, the capacitors C11–C33 are initialized. In this state, the shift registers SR1 and SR2 output low-level signals over the control signal lines g1–g3 and s1–s2 so as to turn off the switches M1–M3 connected to the transfer TFTs T11–T33. As a result, the D electrodes of all photoelectric conversion elements S11–S33 become open-circuited. However, the voltage of these D electrodes are maintained unchanged by the capacitors C11–C33. At this stage, however, no X-ray is incident yet, and therefore no light is incident on any of photoelectric conversion elements S11–S33 and thus no photocurrent flows.

In this state, if an X-ray pulse is generated and is incident on the phosphor CsI after passing through for example a human body, then the X-ray is converted to visible light by the phosphor CsI. The resultant visible light is then incident on the photoelectric conversion elements S11–S33. This light carries information about the internal structure of the human body. Photocurrents flow in response to the light, and charges corresponding to the Photocurrents are stored in the respective capacitors C11–C33. These charges are still stored therein after the irradiation of the X-ray is stopped.

After that, the signal level of the control signal line g1 is raised to a high level by the shift register SR1, and a control pulse signal generated by the shift register SR2 is applied via the control signal lines s1–s3 one by one to the switches M1–M3 connected to the respective transfer TFTs T11–T33. In response, signal voltages v1–v3 are sequentially output. Similarly, under the control of the shift registers SR1 and SR2, other optical signals are read out and resultant signal voltages are sequentially output. Thus, information representing a two-dimensional internal structure of the human body is obtained as v1–v9. When a still image is desired, the operation is complete at this stage. If a moving image is required, the above-described operation is performed repeatedly.

In this photoelectric conversion apparatus including such photoelectric conversion elements, the G electrodes of the respective photoelectric conversion elements are connected together to the common line whose voltage is switched via the switches SWg and SWs between the voltage of the refreshing power supply Vg and the voltage of the reading power supply Vs so that all the photoelectric conversion elements are simultaneously switched between the refreshing mode and the photoelectric conversion mode. This makes it possible to obtain an output voltage corresponding to the optical signal by means of a simple process using only one TFT per pixel.

In this specific embodiment of the photoelectric conversion apparatus including photoelectric conversion elements, nine pixels are two-dimensionally arranged in a 3 3 array, and signals of three pixels are transferred and output at each time wherein such a transferring and outputting operation is performed three times. However, the present invention is not limited to such the number of pixels and the related manner of operation. For example, if 5 5 pixels per 1 mm square are disposed over an area of 40 cm 40 cm, then an X-ray detecting apparatus including 2000 2000 pixels in the area of 40 cm 40 cm can be obtained. If this X-ray detecting apparatus, instead of an X-ray film, is combined with an X-ray generator, then it is possible to realize an X-ray detection apparatus which can be used in an X-ray chest diagnosis or breast cancer diagnosis. Unlike an X-ray apparatus in conjunction with an X-ray film, it is possible to immediately display an image on a CRT. Furthermore, the output signal may be converted into a digital signal and supplied to a computer so that the image is converted into a desired form by means of image processing performed by the computer. Obtained images may be stored on a magneto-optical disk so that any desired image may be retrieved instantaneously. This X-ray detecting apparatus has a higher sensitivity than an X-ray film, and therefore it is possible to obtain a clear X-ray image with a weak X-ray without exerting a significant influence on a human body.

FIGS. 7 and 8 are plan views illustrating two examples of photoelectric conversion apparatus including 2000 2000 pixels. Although a photoelectric conversion apparatus including as large a number of photoelectric conversion elements as 2000 2000 elements may be constructed simply by increasing the number of elements inside the broken line in FIG. 3, as great a number of lines as 2000 lines are required for both control lines and signal lines. Furthermore, the shift registers SR1 and the detection integrated circuit IC should operate for 2000 lines, and thus large-scale circuits are required. If such the shift register SR1 and the detection integrated circuit IC are realized on a single chip, respectively, the chip size will become so large that the production yield will decreases to a very low level and the production cost will increase to a very high level. To avoid such problems, the shift register SR1 may be divided into for example 20 separate shift registers (SR1-1 to SR1-20) each including 100 stages. Similarly, the detection integrated circuit may be divided into for example 20 separate circuits (IC1 to IC20) each responsible for processing 100 lines.

In the example shown in FIG. 7, 20 shift register chips (SR1-1 to SR1-20) are disposed along the left side (L) and 20 detection integrated circuits are disposed along the lower side (D). 100 control lines and 100 signal lines per chip are connected by means of wire bonding. The area surrounded by the broken line in FIG. 7 corresponds to the area surrounded by the broken line in FIG. 3. In FIG. 7, connections to external devices are not shown. Furthermore, SWg, SWs, Vg, Vs, and RF are also not shown. 20 output signals (Vout) are supplied from the detecting integrated circuits IC1 to IC20. These output signals may be combined onto one signal line via a switch or the like or they may be output directly and processed in parallel.

In the case of the example shown in FIG. 8, 10 chips (SR1-1 to SR1-10) are disposed along the left side (L), another 10 chips (SR1-11 to SR1-20) along the right side (R), still another 10 chips (IC1 to IC10) along the upper side (U), and the other 10 chips (IC11 to IC20) along the lower side (L). In this layout, because the lines are divided into four groups located on the upper, lower, left, and right sides, each including 1000 lines, the number of lines per unit length on each side is reduced and therefore the number of wire-bonded lead wires is reduced. This allows an improvement in the production yield. The grouping of lines is performed such that lines g1, g3, g5, . . . , g1999 are disposed on the left side (L), and lines g2, g4, g6, . . . , g2000 are disposed on the right side (R). That is, the odd-numbered control lines are located on the left side (L) and the even-numbered control lines are located on the right side (R) so that the distance between any adjacent two control lines is equal and control lines are not concentrated in any particular area. This also allows an improvement in the production yield. The grouping of lines into the upper and lower sides may be performed in a similar manner.

Although not shown in any figures, the grouping of lines may also be performed in such a manner that g1–g100, g201–g300, ..., g1801–g1900 are located on the left side (L) and g101–g200, g301–g400, ..., g1901–g2000 are located on the right side (R), that is, successive control lines associated with one chip are brought together into one group and groups of control lines are alternately located on right and left sides. In this case, the control lines of each chip can be processed successively from line to line and therefore there is no special difficulty associated with the driving timing and thus it is not required to use a complicated and expensive circuit. The lines on the upper and lower sides can also be processed successively from line to line, and no special complicated and expensive circuit is required.

In either structure shown in FIGS. 7 and 9, the circuit in the area surrounded by the broken line may first be formed on a substrate, and then chips may be mounted on the same substrate. Alternatively the circuit in the area surrounded by the broken line formed on a substrate may be mounted together with other chips on another substrate. Otherwise, after mounting chips on a flexible substrate, the flexible substrate may be bonded to the substrate on which the circuit in the area surrounded by the broken line.

Photoelectric conversion apparatus including such a great number of pixels arranged in a large area cannot be produced by the conventional complicated processing technique using the conventional photosensor structure. In contrast, the processing technique of producing a photoelectric conversion apparatus, which has been proposed before by the inventor of the present invention, includes a small number of easy and simple processing steps whereby respective elements are simultaneously produced using films in common. Thus, a large-sized high-quality photoelectric conversion apparatus can be produced at low cost. Furthermore, since a capacitor, a TFT, and a photoelectric conversion element can all be formed within the same pixel, the substantial number of elements decreases to ½, which allows a further improvement in the production yield.

In the photoelectric conversion apparatus including photoelectric conversion elements having the structure shown in FIG. 4, as described above, each photoelectric conversion element for use in detecting the intensity of light has only one injection barrier. Therefore, it is possible to easily optimize the production process, an improvement in the production yield, and a reduction in the production cost. Thus, it is possible to produce a photoelectric conversion apparatus with a high signal-to-noise ratio at low cost.

Neither the tunnel effect nor a Schottky barrier is used in the multilayer structure consisting of first electrode layer/insulating layer/photoelectric conversion semiconductor layer. Therefore, the material of the electrode can be selected from a wide variety of materials. Furthermore, the thickness of the insulating layer and other parameters can be determined in a more flexible fashion.

Furthermore, the structure of the photoelectric conversion elements well matches the structures of switching elements such as TFTs and/or capacitors which are simultaneously formed together with the photoelectric conversion elements using the films in common. The main film structures which are important in the photoelectric conversion elements and TFTs are simultaneously formed in the same vacuum chamber. This allows a further improvement in the signal-to-noise ratio and a further reduction in the production cost.

Furthermore, it is possible to produce high-performance capacitors including an insulating film between electrodes. Thus, it is possible to provide a high-performance photoelectric conversion apparatus with a simple structure capable of obtaining the integrals of optical information obtained via the plurality of photoelectric conversion elements.

Furthermore, it is also possible to provide a large-sized, high-performance and low-cost facsimile machine and X-ray detection apparatus.

Furthermore, it is also possible to obtain a photoelectric conversion apparatus capable of detecting an X-ray, if a wavelength converter such as a phosphor having the capability of converting the X-ray to light with a wavelength which can be detected by photoelectric conversion elements is disposed on the above-described photoelectric conversion apparatus according to the present invention.

In the present invention, as described above, a shielding member is disposed on a proper photoelectric conversion element so that this photoelectric conversion element acts as a correction photoelectric conversion element. This makes it unnecessary to further form a separate photoelectric conversion element for use in correction, thus making it unnecessary to provide an additional correction circuit separately from the circuit for driving the photoelectric conversion elements.

Thus, the present invention can provide a high-performance low-cost photoelectric conversion apparatus capable of detecting information with high accuracy and high reliability.

DESCRIPTION OF THE PREFERRED EMBODIMENT

The present invention will be described in further detail below with reference to preferred embodiments in conjunction with the accompanying drawings.

First Embodiment

Figure 9:
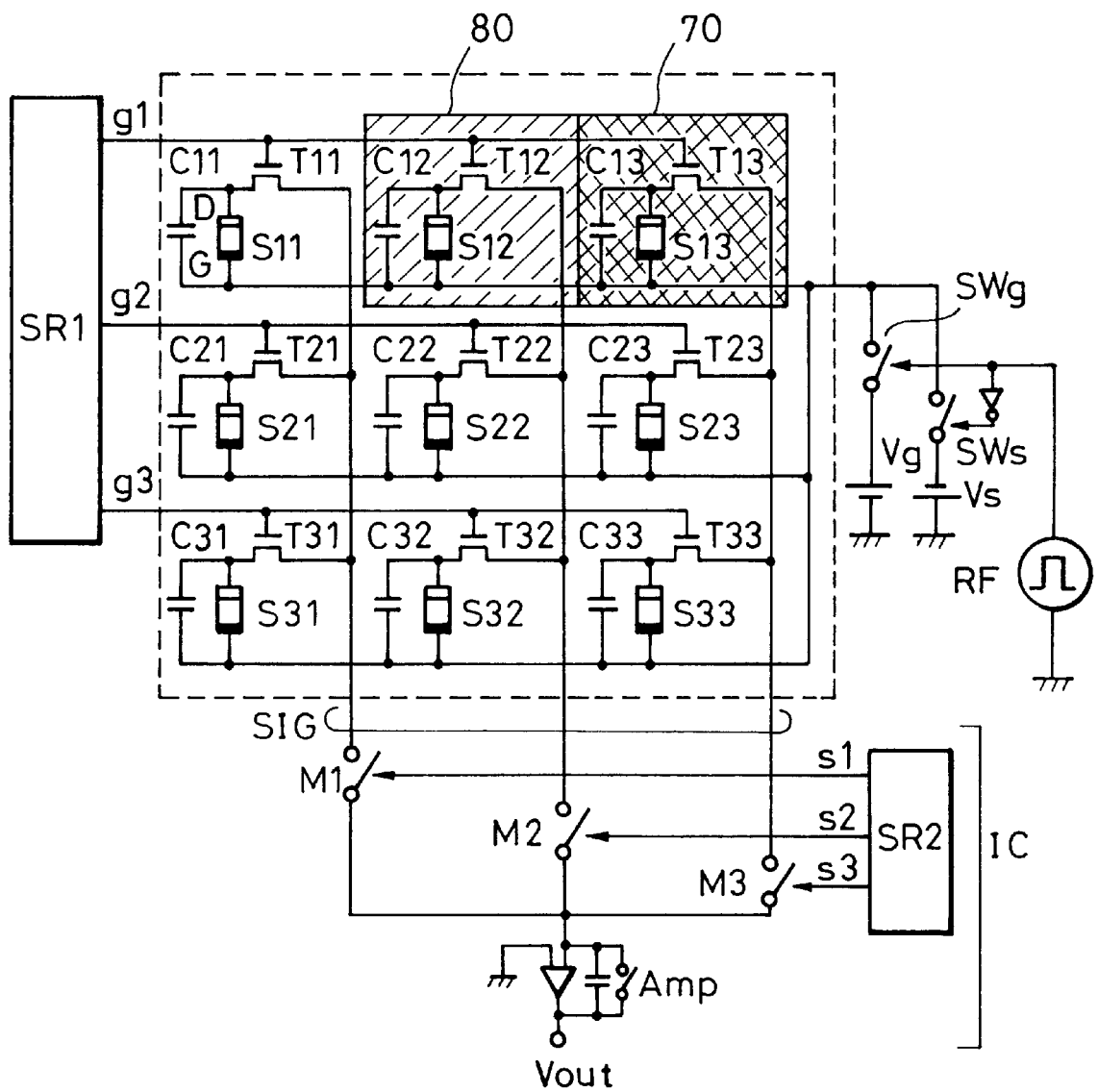
FIG. 9 is a schematic diagram illustrating an example of a photoelectric conversion apparatus according to the present invention.

FIG. 9 is a circuit diagram generally illustrating a photoelectric conversion apparatus.

Figure 1A:
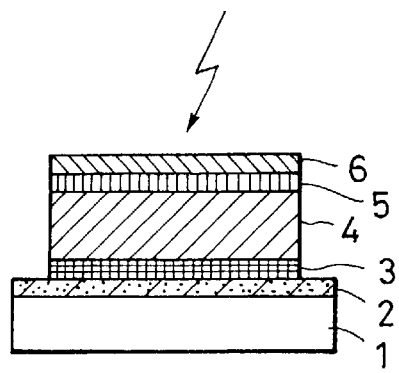
FIGS. 1A and 1B are cross-sectional views schematically illustrating examples of photosensors.
Figure 1B:
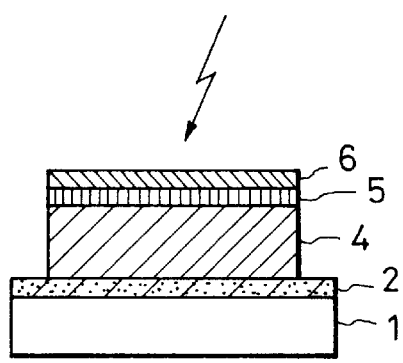
Figure 1C:
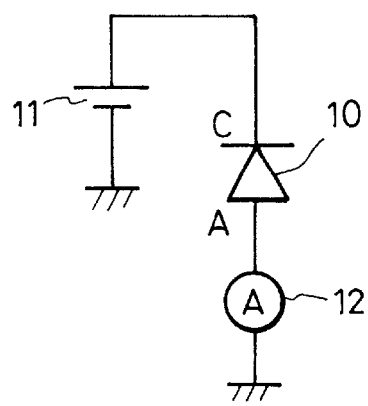
FIG. 1C is a circuit diagram illustrating an example of a method of driving a photosensor.
Figure 2:
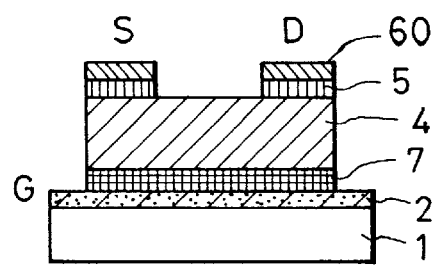
FIG. 2 is a cross-sectional view schematically illustrating an example of the structure of a thin film transistor.
Figure 3:
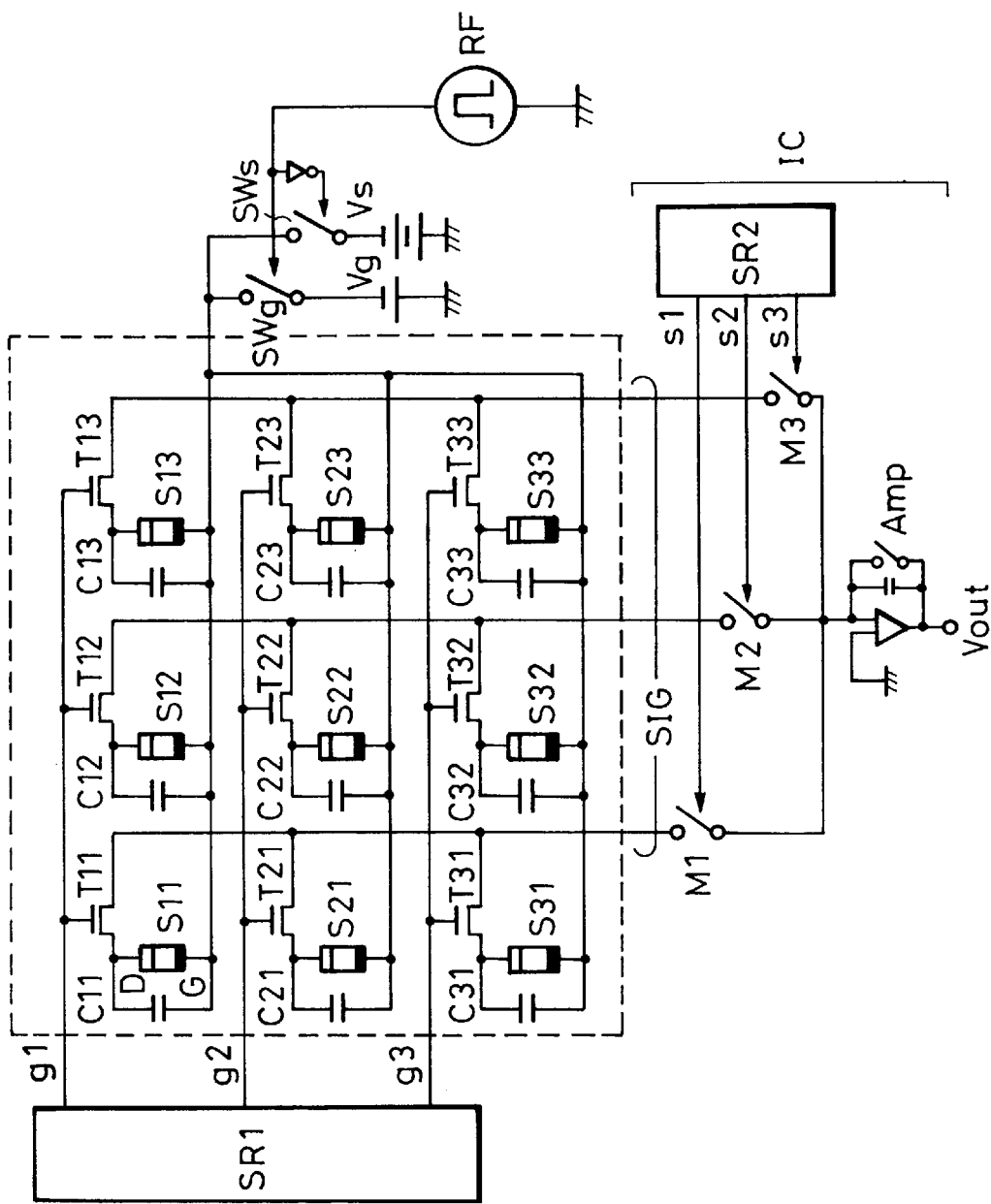
FIG. 3 is a circuit diagram illustrating an example of the circuit configuration of a photoelectric conversion apparatus.

The photoelectric conversion apparatus shown in the circuit diagram of FIG. 9 is basically the same as that shown in FIG. 3 except that photoelectric conversion elements S11–S13 are used to correct the output signal. More particularly, a light-blocking element (a light-blocking filter) 70 with a light transmittance of zero is disposed on the photoelectric conversion element S13, and a light-blocking element (a light-blocking filter) 80 with a light transmittance of 50% is disposed on the photoelectric conversion element S12.

Figure 10A:
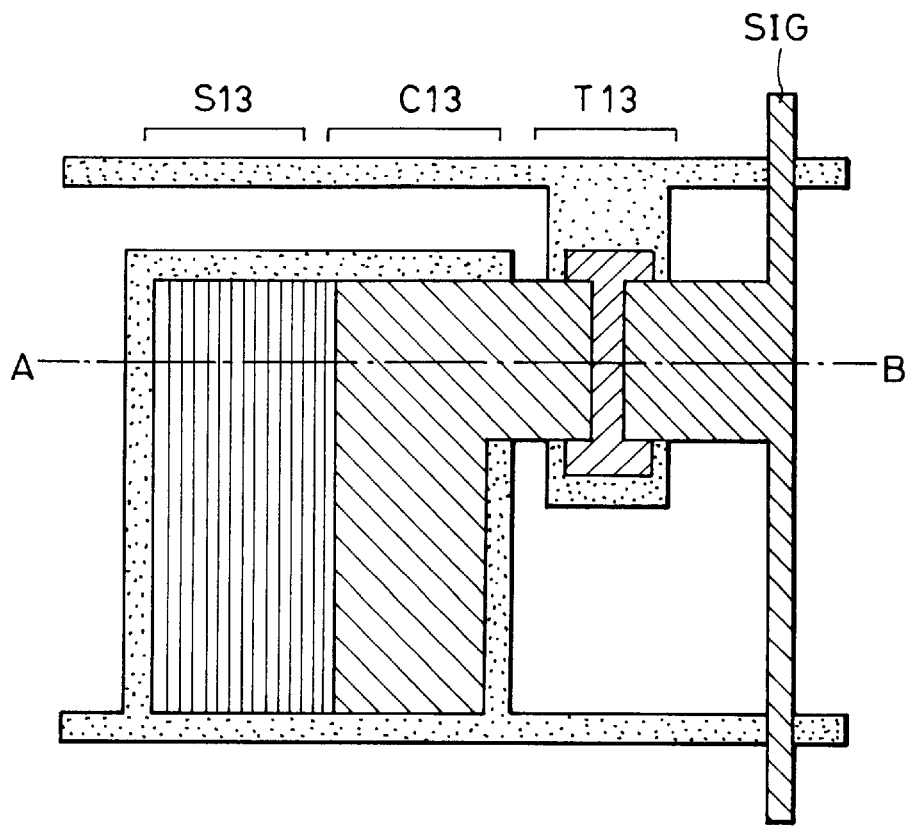
FIGS. 10A and 10B together a schematic diagram illustrating an example of a photoelectric conversion element for use in correction process, provided in the photoelectric conversion apparatus according to the present invention, wherein its plan view and cross-sectional view are shown in FIGS. 10A and 10B, respectively.
Figure 10B:
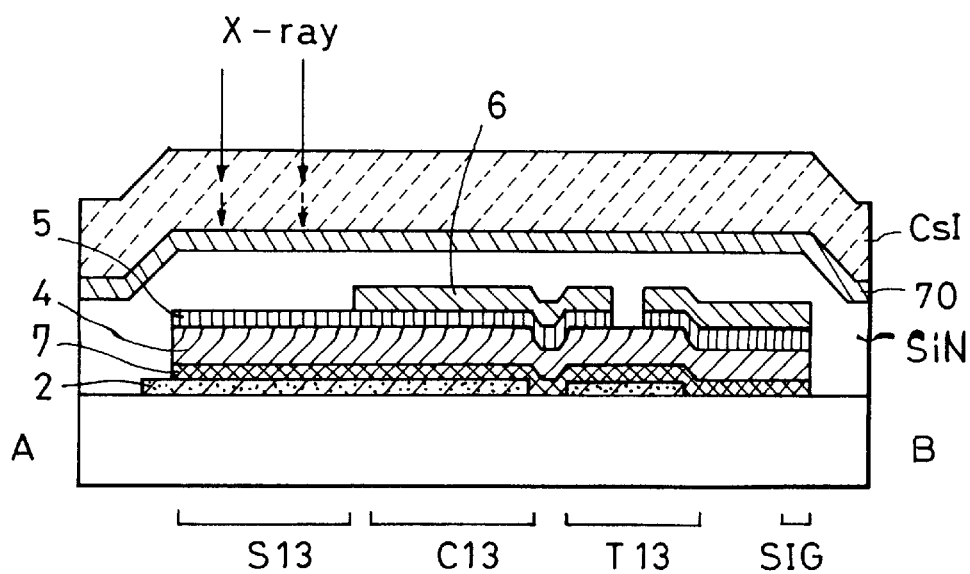

FIGS. 10A and 10B are a plan view and a cross-sectional view, respectively, schematically illustrating examples of C13, T13, and S13. These elements are basically the same as those shown in FIG. 4 except that the light-blocking element (light-blocking filter) 70 with a light transmittance of zero is disposed between CsI and SiN of C13, T13, and S13.

Figure 11:
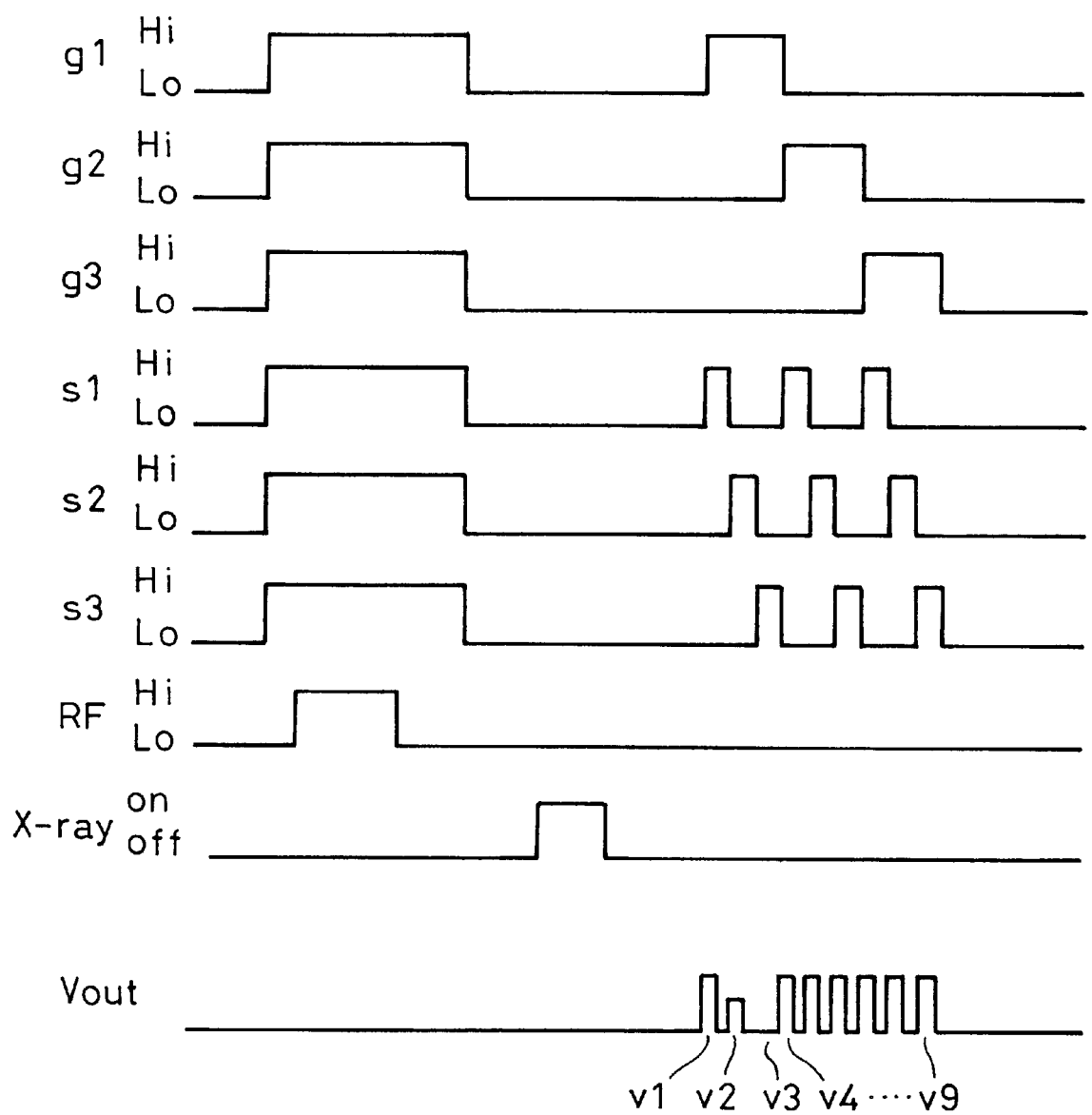
FIG. 11 is a timing chart illustrating an example of the operation of driving the photoelectric conversion apparatus according to the present invention.
Figure 12:
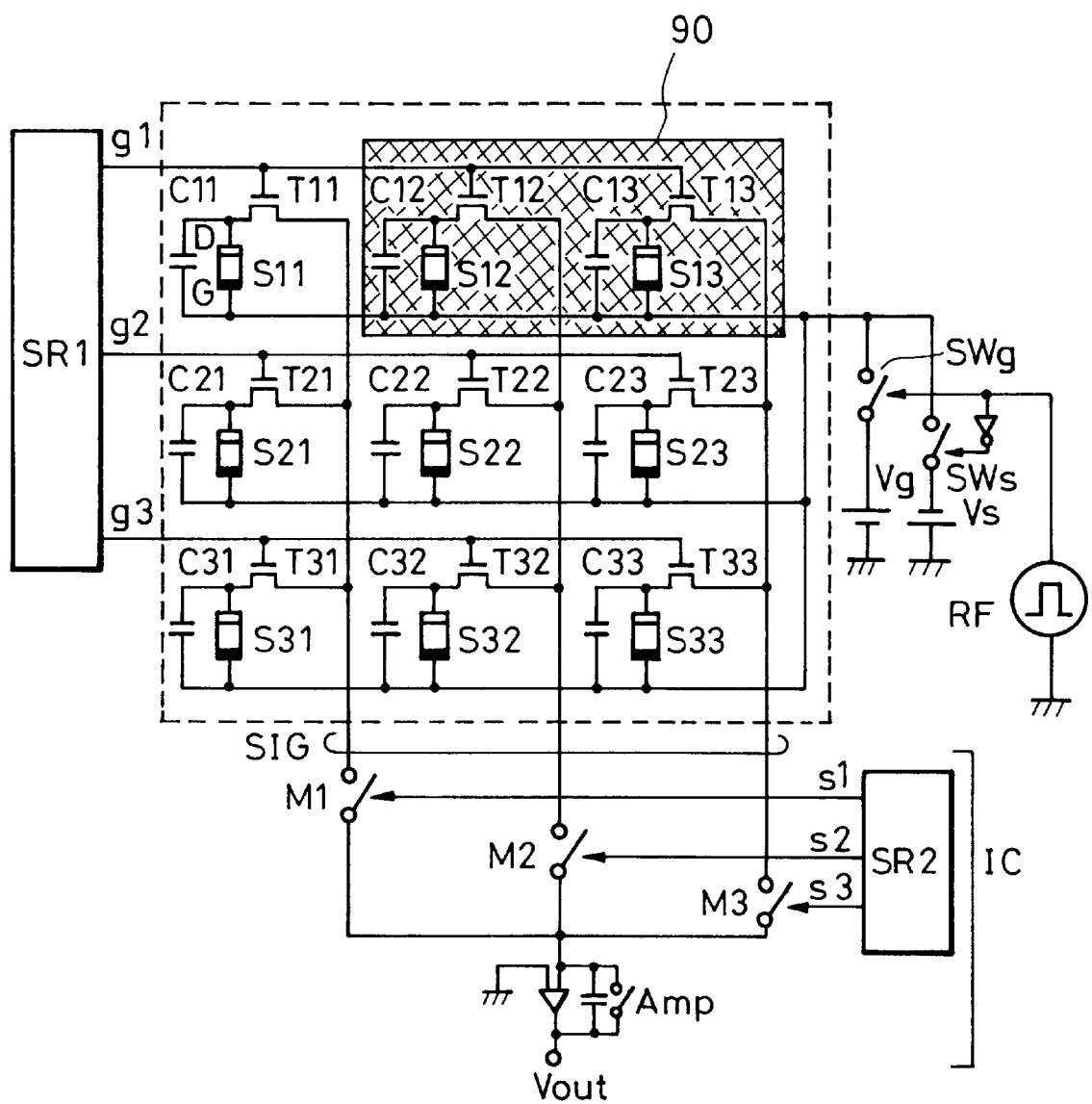
FIG. 12 is a schematic diagram illustrating another example of a photoelectric conversion apparatus according to the present invention.

FIG. 11 is a timing chart illustrating an example of the operation of the photoelectric conversion apparatus according to the present embodiment.

The timing chart of FIG. 11 illustrates the operation which occurs when the photoelectric conversion apparatus is uniformly irradiated by an X-ray. Therefore, of the output signals Vout, v1 and v4–v9 have a substantially equal value.

On the other hand, the output signal v3 equals zero, because the photoelectric conversion element S13 is covered, as described above, with the light-blocking element (light-blocking filter) 70 whose light transmittance is substantially zero.

The output signal v2 has a value equal to one-half the value of the output signals v1 and v4–v9, because the photoelectric conversion element S12 is covered with the light-blocking element (light-blocking filter) 80 with a light transmittance of 50%.

The offset correction can be made on the basis of the output signal v3 generated by the photoelectric conversion element covered with the light-blocking element (light-blocking filter) 70 with the light transmittance of zero.

More specifically, the offset correction is performed by applying the output signal v3 of the above-described photoelectric conversion element to the offset correction integrated circuit so that the value of the output signal v3 is subtracted from the values of the output signals v1 and v4 to v9.

On the other hand, the sensitivity correction is performed on the basis of the output signal v2 of the photoelectric conversion element covered with the light-blocking element (light-blocking filter) 80 whose light transmittance is 50% and also on the basis of the output signal of a photoelectric conversion element covered with no filter, for example the output signal v1.

More specifically, the output signals v1 and v2 generated by the above-described two photoelectric conversion elements are applied to the sensitivity correction integrated circuit and the value of the output signal v1 is subtracted from the respective values of v4 to v9. The resultant values are multiplied by 0.5, and the sensitivity correction is performed on the basis of the resultant multiplied values.

Although in the present embodiment, the filter has a light transmittance of 50%, the value of the light transmittance is not limited to 50%. The filter may have an arbitrary light transmittance within the range greater than zero and smaller than 100% (if the light transmittance is denoted by m, 0<m<50%).

Second Embodiment

Figure 4:
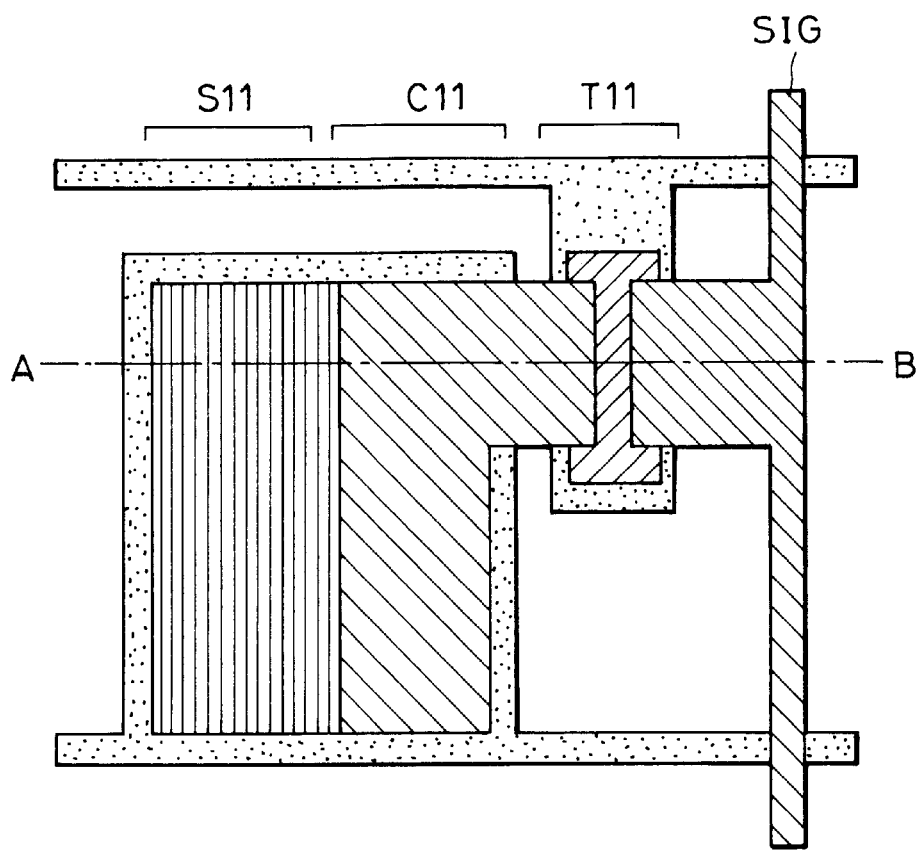
FIG. 4 is a plan view illustrating an example of the structure of one pixel of the photoelectric conversion part shown in FIG. 3.
Figure 5:
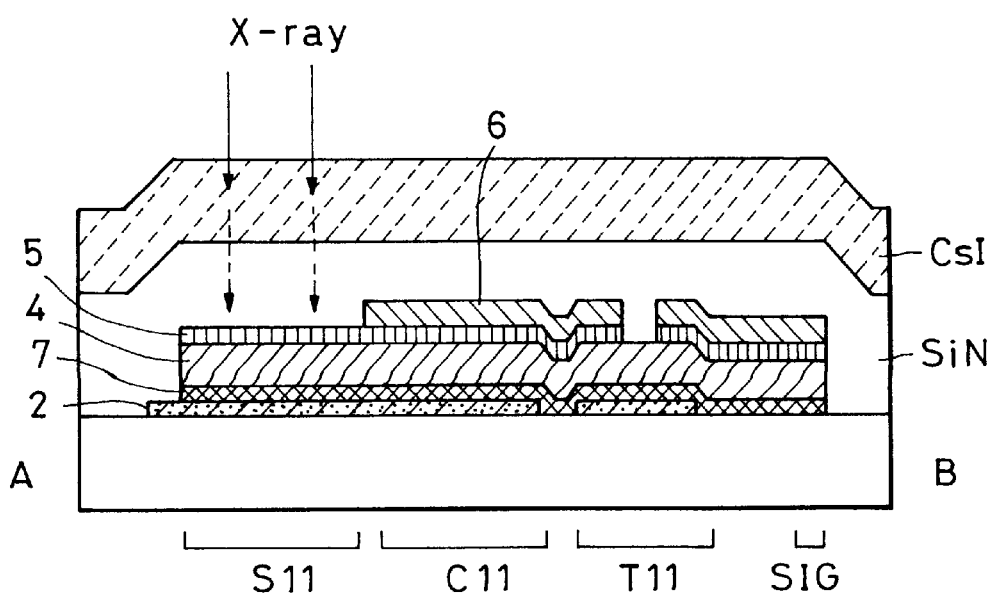
FIG. 5 is a cross-sectional view illustrating the structure of one pixel of the photoelectric conversion part shown in FIG. 4.
Figure 6:
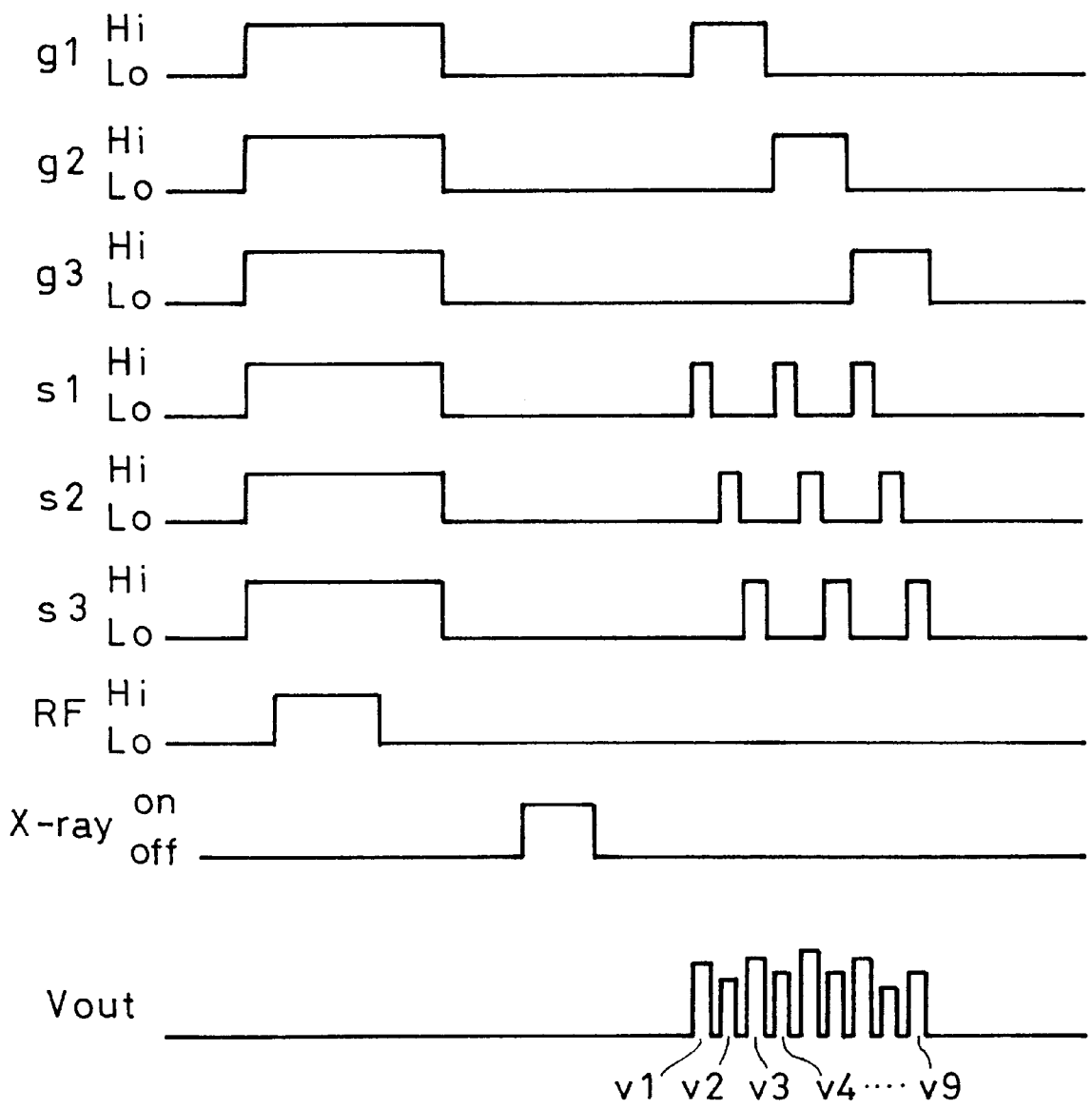
FIG. 6 is a timing chart illustrating an example of the operation of driving the photoelectric conversion apparatus shown in FIG. 3.
Figure 7:
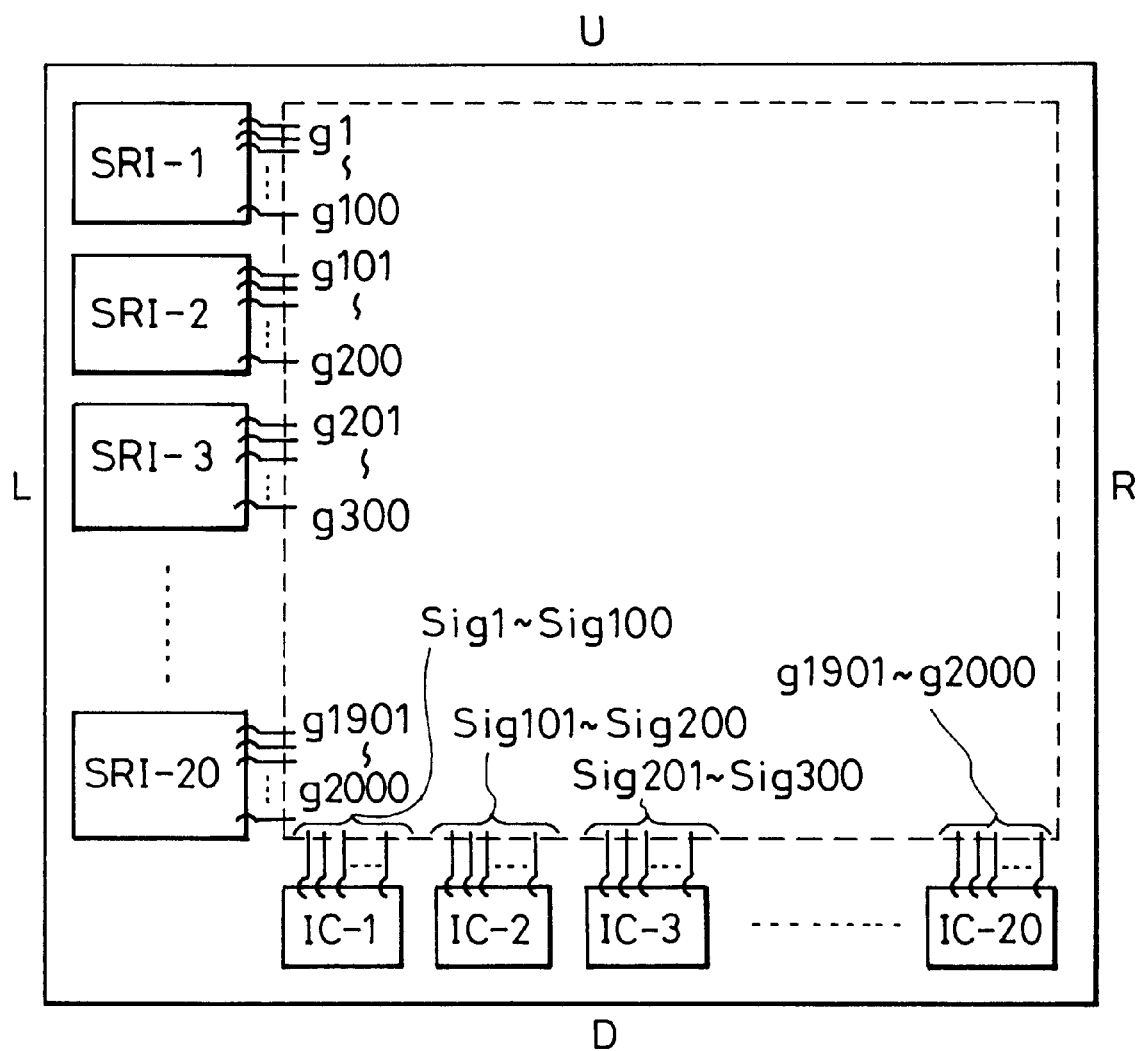
FIG. 7 is a plan view illustrating an example of the mounting layout of a photoelectric conversion apparatus.
Figure 8:
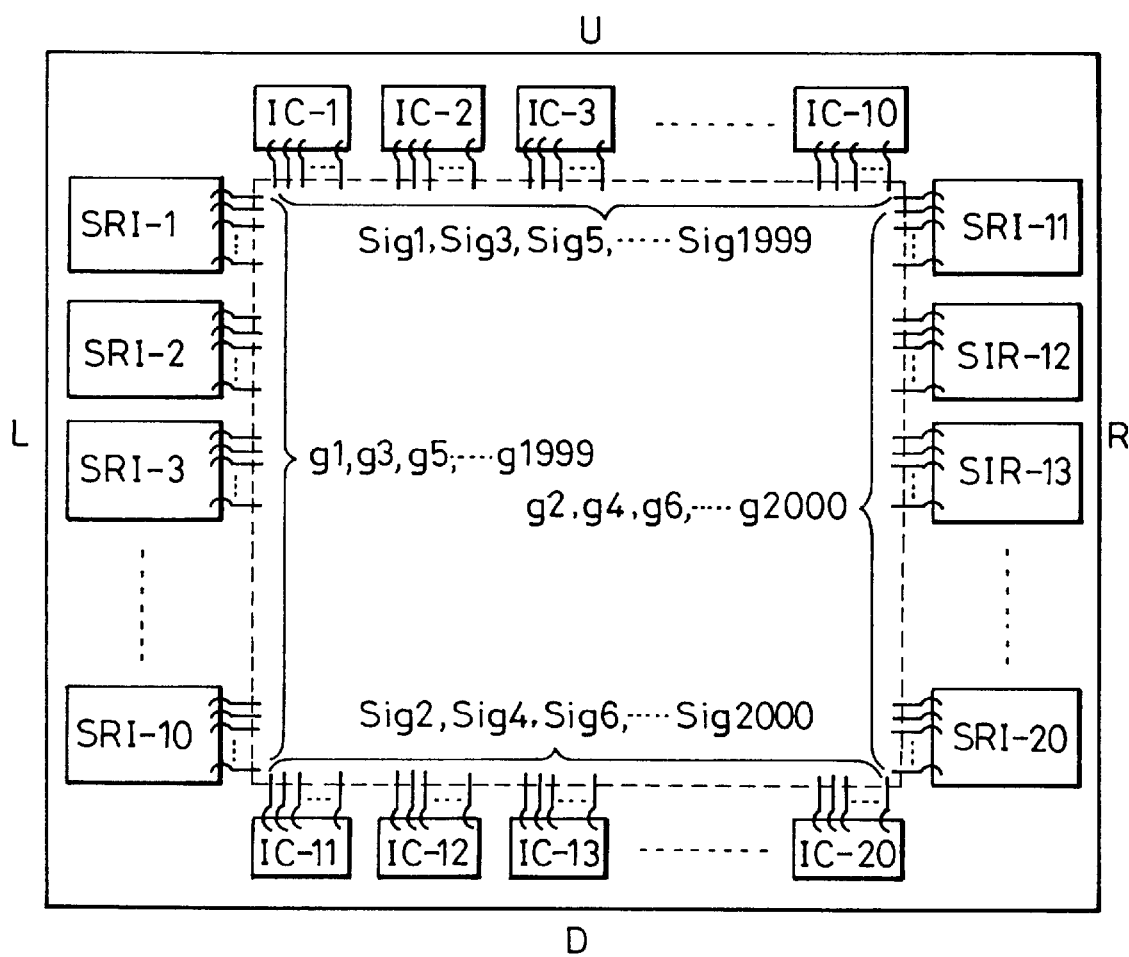
FIG. 8 is a plan view illustrating another example of the mounting layout of a photoelectric conversion apparatus.

FIG. 4 is a circuit diagram generally illustrating a second embodiment of a photoelectric conversion apparatus according to the present invention.

The photoelectric conversion apparatus of this embodiment is basically the same as that shown in FIG. 3 except that photoelectric conversion elements S11–S13 are used to correct the output signal. More particularly, a lead plate 90 having an X-ray transmittance of zero or substantially zero is disposed on the phosphor CsI located on the photoelectric conversion elements S12 and S13 so that the intensity of the X-ray striking the phosphor CsI located on the photoelectric conversion elements S12 and S13 becomes substantially zero.

Figure 13A:
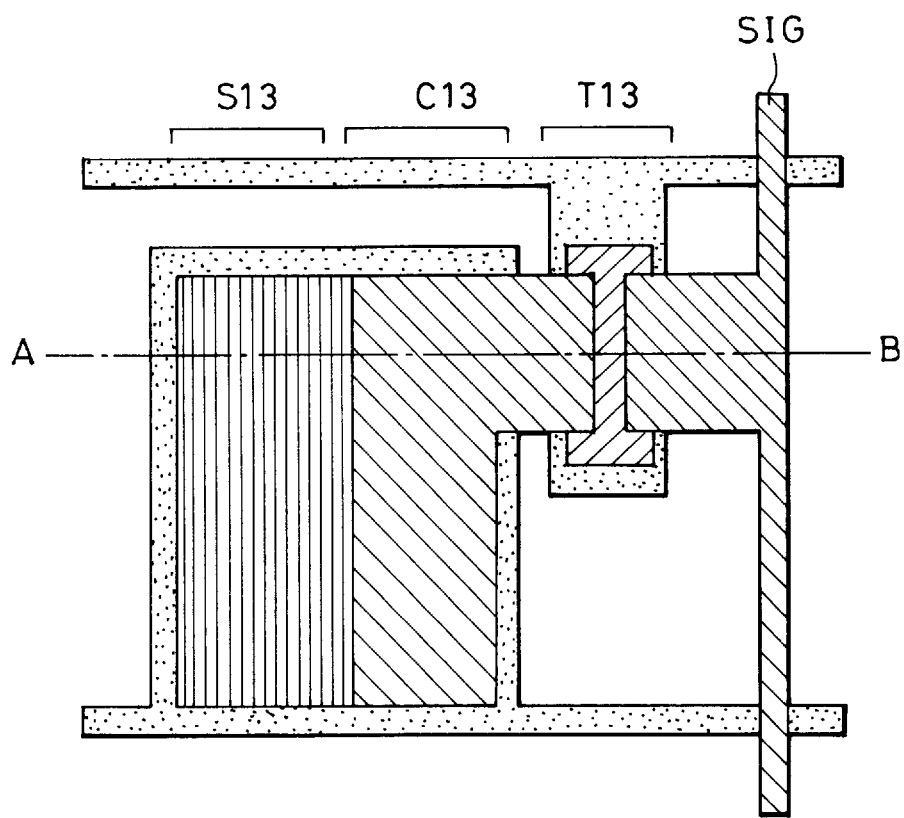
FIGS. 13A and 13B together form a schematic diagram illustrating another example of a photoelectric conversion element for use in correction process, provided in the photoelectric conversion apparatus according to the present invention, wherein its plan view and cross-sectional view are shown in FIGS. 13A and 13B, respectively.
Figure 13B:
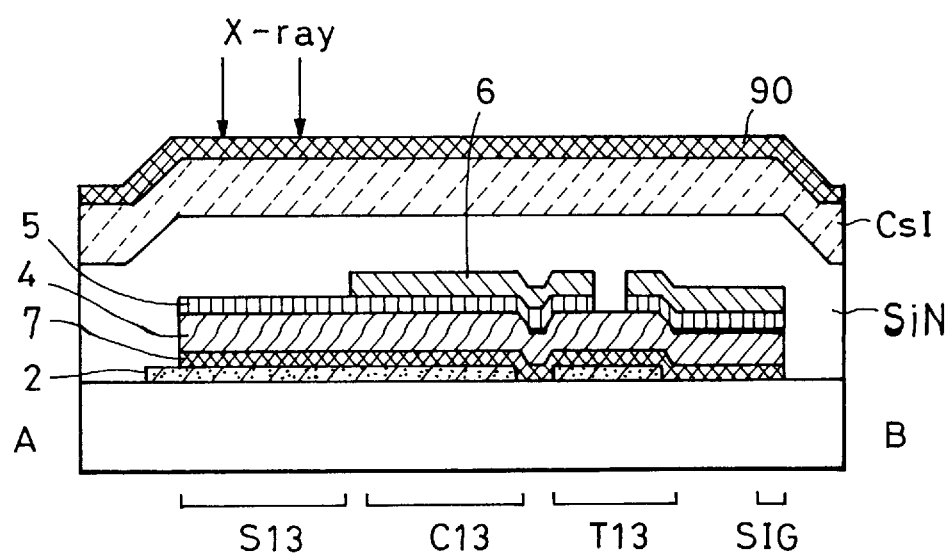

FIGS. 13A and 13B are a plan view and a cross-sectional view, respectively, schematically illustrating examples of C13, T13, and S13. In this embodiment, the lead plate 90 having an X-ray transmittance of substantially zero is disposed on the phosphor CsI of C13, T13, and S13.

Figure 14:
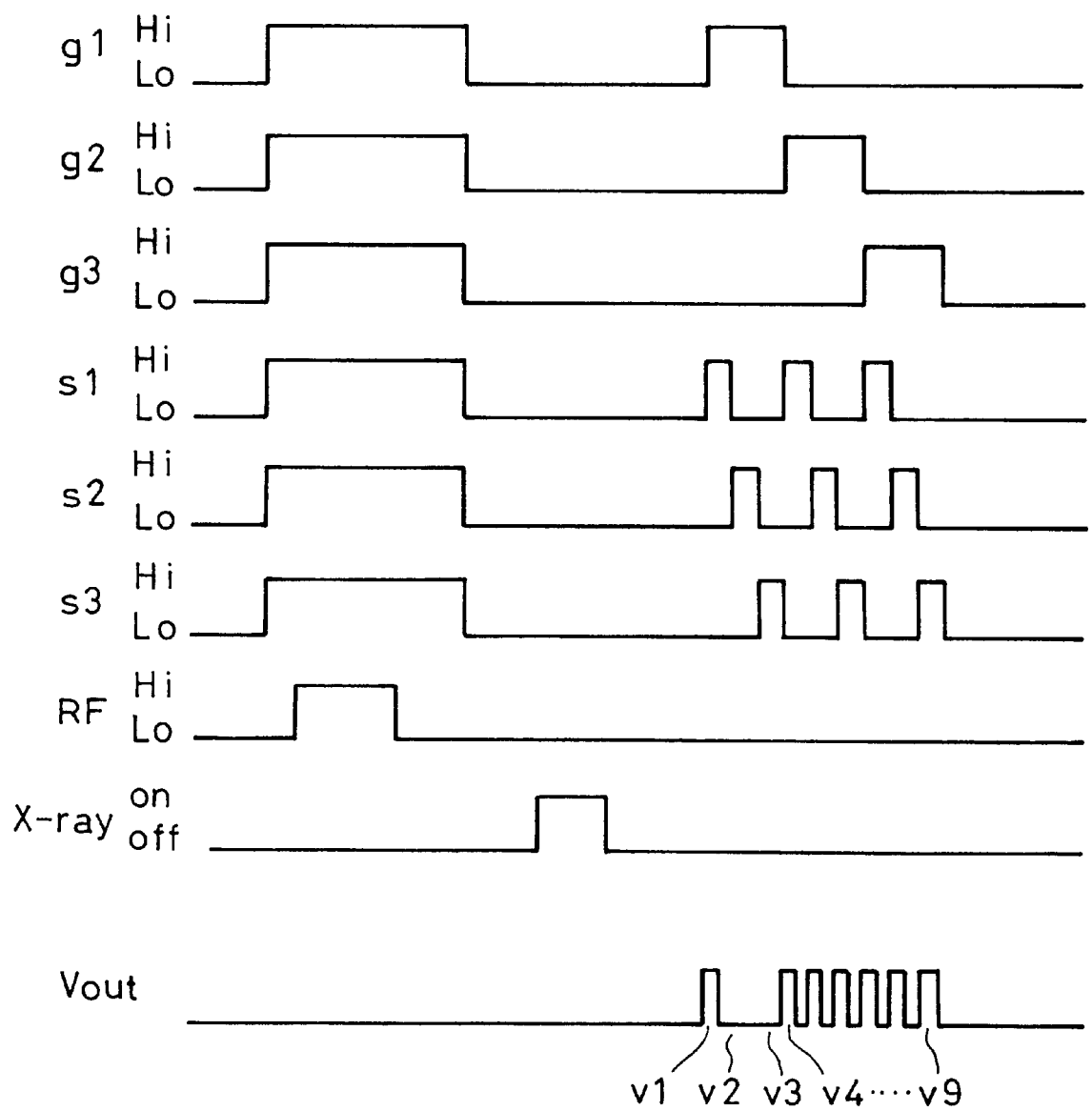
FIG. 14 is a timing chart illustrating an example of the operation of driving the photoelectric conversion apparatus according to the present invention.

FIG. 14 is a timing chart illustrating the operation of the photoelectric conversion apparatus according to the second embodiment of the invention.

The timing chart of FIG. 14 illustrates the operation which occurs when the photoelectric conversion apparatus is uniformly irradiated by an X-ray. Therefore, of the output signals Vout, the signals v1 and v4 to v9 have a substantially equal value.

On the other hand, the output signals v2 and v3 are equal to zero, because, as described above, phosphors CsI on the photoelectric conversion elements S12 and S13 are covered with the lead plate 90 whose X-ray transmittance is zero.

The offset correction can be made on the basis of the output signal v2 or v3 generated by either photoelectric conversion element covered with the lead plate 90 whose X-ray transmittance is zero.

More specifically, the offset correction is performed by applying the output signal v2 or v3 of either one of the above-described photoelectric conversion elements to the offset correction integrated circuit so that the value of the output signal v2 or v3 is subtracted from the values of the output signals v1 and v4 to v9.

Third Embodiment

Figure 15:
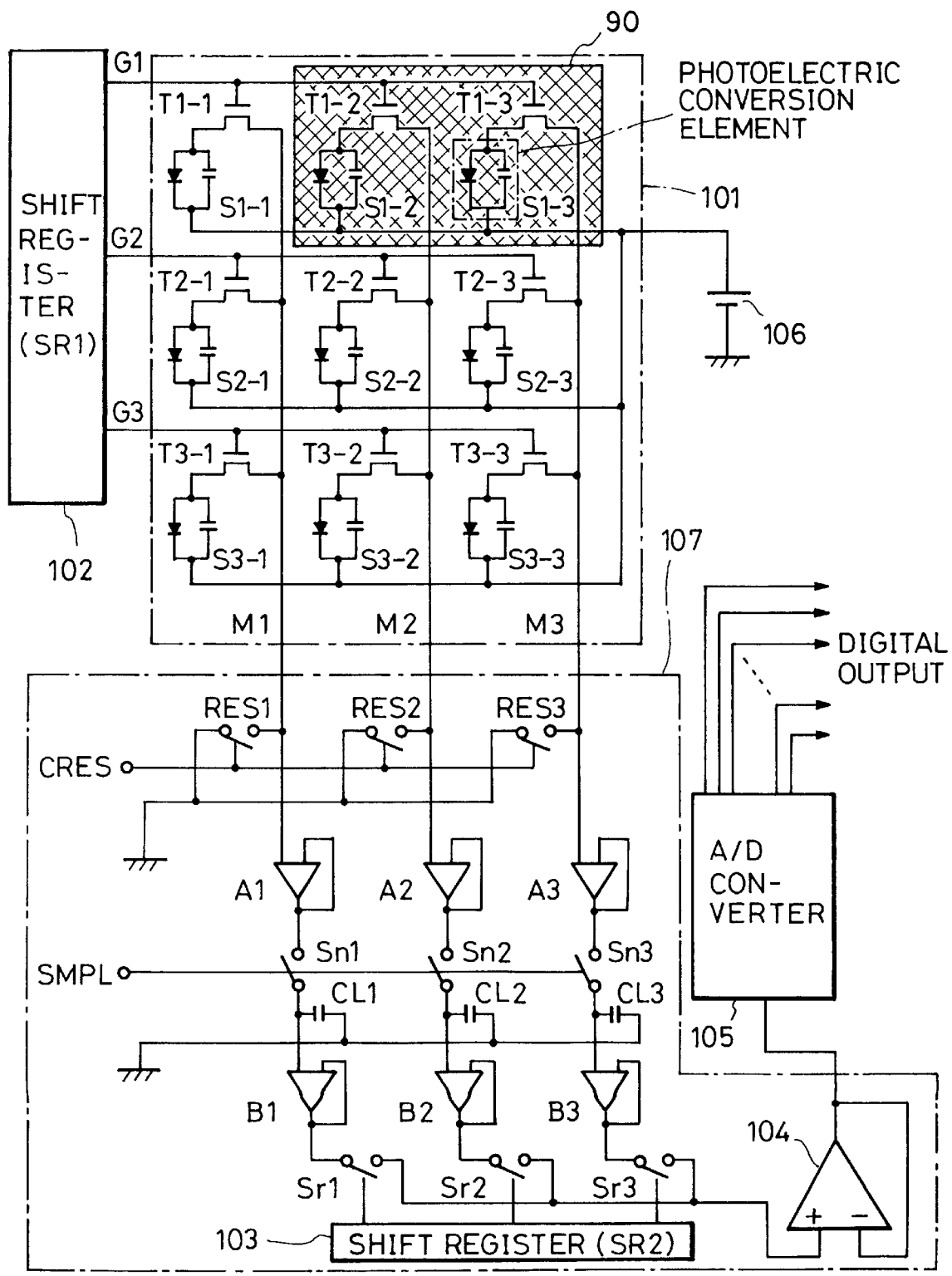
FIG. 15 is a circuit diagram illustrating still another embodiment of a photoelectric conversion apparatus according to the present invention.

FIG. 15 is a circuit diagram illustrating a third embodiment of a photoelectric conversion apparatus according to the present invention. In FIG. 15, for simplicity of description, the photoelectric conversion apparatus includes nine pixels arranged in a 3 3 array. Reference symbols S1-1 to S3-3 denote photoelectric conversion elements for converting received visible light to electric signals. T1-1 to T3-3 denote switching elements for transferring signal charges, which are generated via the photoelectric conversion process performed by the photoelectric conversion elements S1-1 to S3-3, to matrix signal lines M1 to M3. G1 to G3 denote lines which are connected to a shift register (SR1) and also to the switching elements T1-1 to T3-3 and which are used to drive the gates of the respective switching elements T1-1 to T3-3.

In the circuit of the photoelectric conversion apparatus shown in FIG. 15, photoelectric conversion elements S1-1 to S1-3 are used to correct the output signal. More particularly, a lead plate 90 having an X-ray transmittance of substantially zero is disposed on the phosphor CsI located on the photoelectric conversion elements S1-2 and S1-3. During the signal transferring operation, the sum of the electrode-to-electrode capacitance (Cgs) of three switching elements is added to the matrix signal line M1 although no capacitors are shown in FIG. 15. The other matrix signal lines M2 and M3 are also connected to similar capacitance. In the photoelectric conversion circuit 101 in FIG. 15, there are shown the photoelectric conversion elements S1-1 to S3-3, the switching elements T1-1 to T3-3, the gate driving lines G1 to G3, and the matrix signal lines M1 to M3. The photoelectric conversion circuit 101 is formed on an insulating substrate. Reference numeral 102 denotes a shift register (SR1) serving as a driving circuit for opening and closing the switching elements T1-1 to T3-3. A1 to A3 denote operational amplifiers for amplifying the signal charges supplied via the matrix signal lines M1 to M3 and performing impedance conversion, although, in FIG. 15, the operational amplifiers A1 to A3 are represented in a simplified form of a buffer amplifier serving as a voltage follower. Sn1 to Sn3 denote transfer switches for reading the outputs signals on the matrix signal lines M1 to M3 via the operational amplifiers and then transferring the output signals to capacitors CL1 to CL3. The signals stored in the reading capacitors CL1 to CL3 are read by switches Sr1 to Sr3 via buffer amplifiers B1 to B3 each serving as a voltage follower. Reference numeral 103 denotes a shift register (SR2) for controlling the operation of the reading switches Sr1 to Sr3. The parallel signals stored in the CL1 to CL3 are converted to a serial signal by the reading switches Sr1 to Sr3 and the shift register (Sr2) 103. The resultant serial signal is applied to an operational amplifier 104 serving as a voltage follower at the final stage, and then converted to a digital signal by an A/D converter 105. RES1 to RES3 denote reset switches for resetting the signal components stored in the capacitors (gate-to-source capacitors of three switching elements) connected to the matrix signal lines M1 to M3. In response to a pulse supplied via a terminal CRES, the reset switches RES1 to RES3 reset the capacitors to a predetermined reset voltage (GND voltage in the specific example shown in FIG. 15). Reference numeral 106 denotes a power supply for supplying a bias voltage to the photoelectric conversion elements S1-1 to S3-3. A reading circuit 107 is formed with the buffer amplifiers A1 to A3, the transfer switches Sn1 to Sn3, the reading capacitors CL1 to CL3, the buffer amplifiers B1 to B3, the reading switches Sr1 to Sr3, the shift register SR2, the final-stage operational amplifier 104, and the reset switches RES1 to RES3.

In this circuit configuration, a particular photoelectric conversion element is shielded from an X-ray by a lead plate thereby canceling offset components which occur when the photoelectric conversion elements are irradiated by no X-ray.

Fourth Embodiment

Figure 16:
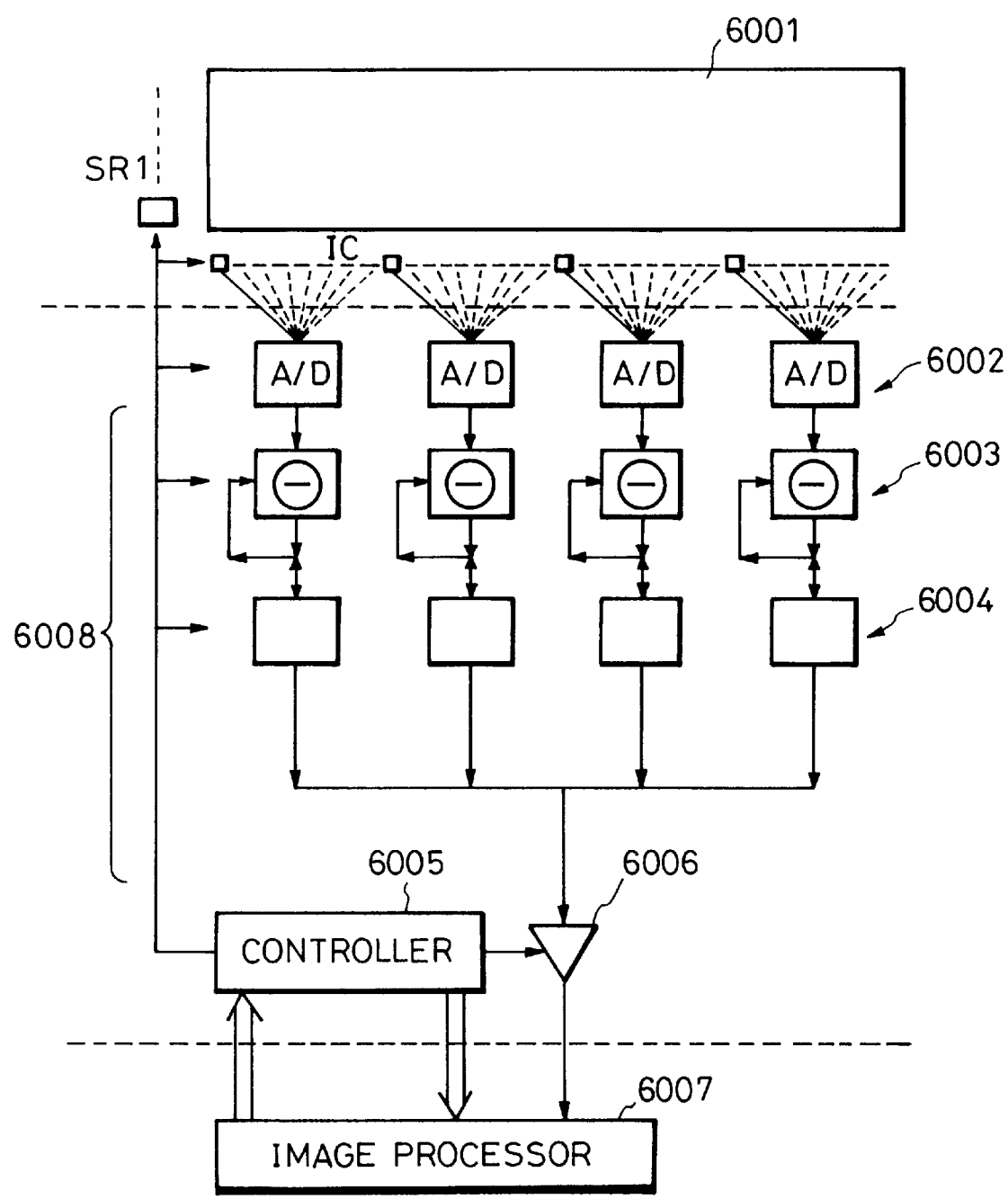
FIG. 16 is a circuit diagram illustrating still another embodiment of a photoelectric conversion apparatus according to the present invention.

FIG. 16 is a block diagram generally illustrating an example of a system using a photoelectric conversion apparatus according to the present invention. In FIG. 16, reference numeral 6001 denotes a sensor substrate. The system includes a plurality of shift registers SR1 connected in series and a plurality of detection integrated circuits. The output signals of the detection integrated circuits are supplied to analog-to-digital converters 6002 in a processing circuit 6008 and converted to digital signals. The digital output signals of the analog-to-digital converters 6002 are supplied, via subtractors 6003 for making fixed pattern corrections, to memories 6004 and are stored therein. Under the control of a controller 6005, the information stored in the memories 6004 is transferred dia the buffer 6006 to an image processor 6007 serving as signal processing means, and subjected to image processing therein.

Figure 17A:
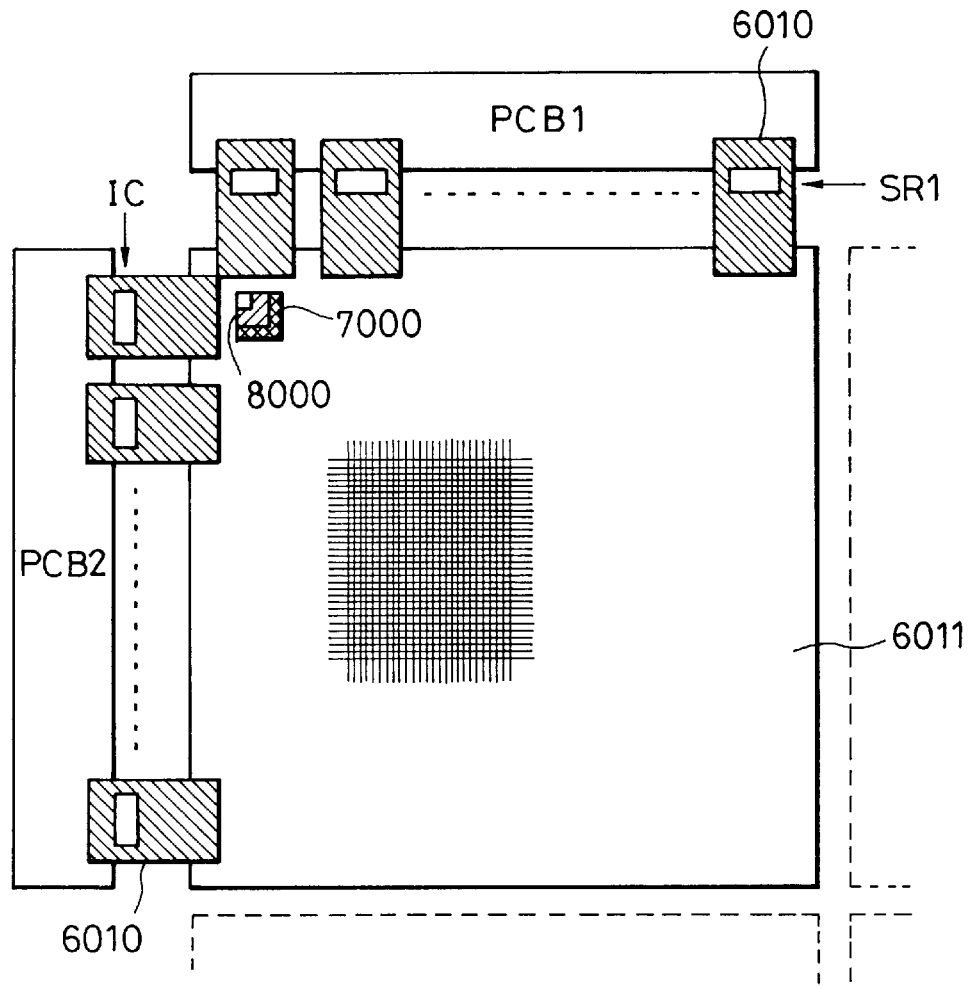
FIGS. 17A and 17B together form is a schematic diagram illustrating an embodiment of a photoelectric conversion apparatus according to the present invention, wherein its plan view and cross-sectional view are shown in FIGS. 17A and 17B, respectively.
Figure 17B:
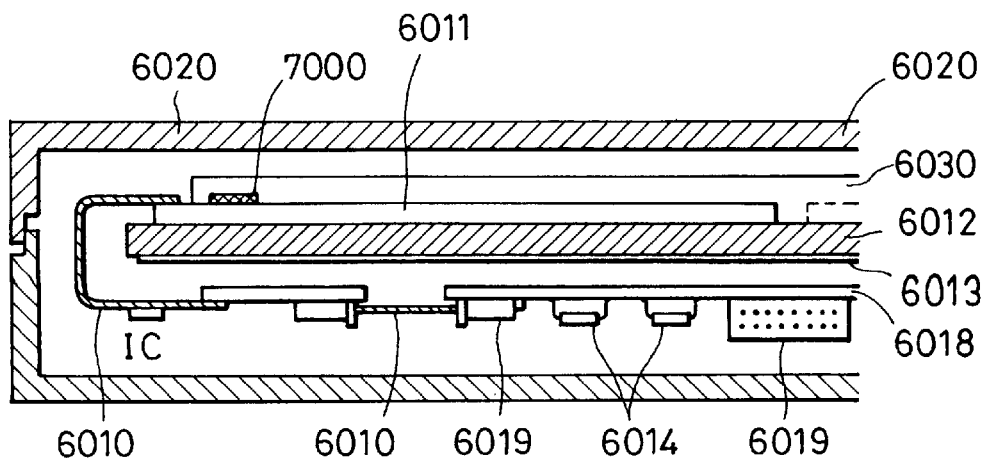

FIGS. 17A and 17B are a plan view and a cross-sectional view, respectively, schematically representing an example of a photoelectric conversion apparatus for detecting an X-ray, according to the present invention.

In FIG. 17, a plurality of sets of a photoelectric conversion element and a TFT are formed on a sensor substrate 6011. Flexible circuit boards 6010 on which a shift register SR1 or a detection integrated circuit is mounted are connected to the sensor substrate 6011. The other end of each flexible circuit board 6010 is connected to a circuit board PCB1 or PCB2. A plurality of sensor substrates 6011 are bonded to a base substrate 6012 so that they are mounted thereon. On the back surface of the base substrate 6012 making up a large-sized photoelectric conversion apparatus, there is provided a lead plate 6013 for protecting a memory 6014 in a processing circuit 6018 from irradiation of an X-ray. On the sensor substrate 6011, there is provided a phosphor 6030 (such as a CsI) serving as a wavelength converter for converting an X-ray to light such as visible light detectable by the photoelectric conversion elements wherein the phosphor 6030 is disposed on the sensor substrate 6011 using an adhesive or by means of coating. As in the above-described technique for detecting an X-ray, it is possible to detect an X-ray by detecting the intensity of visible light corresponding to the intensity of the X-ray. In the present embodiment, as shown in FIG. 17B, the entire apparatus is enclosed in a case 6020 made of carbon fiber.

In this embodiment, a light-blocking element (light-blocking filter) 7000 with a light transmittance of zero and a light-blocking element (light-blocking filter) 8000 with a light transmittance of 50% are disposed on the top and extreme left side of the sensor substrate 6011. The offset correction is made on the basis of the output signal generated by a photoelectric conversion element covered with the light-blocking element (light-blocking filter) 7000 whose light transmittance is zero. The sensitivity correction is made on the basis of the output signal generated by a photoelectric conversion element covered with the light-blocking element (light-blocking filter) 8000 whose light transmittance is 50% and also on the basis of the output signal generated by a photoelectric conversion element covered with no light-blocking element.

Fifth Embodiment

Figure 18A:
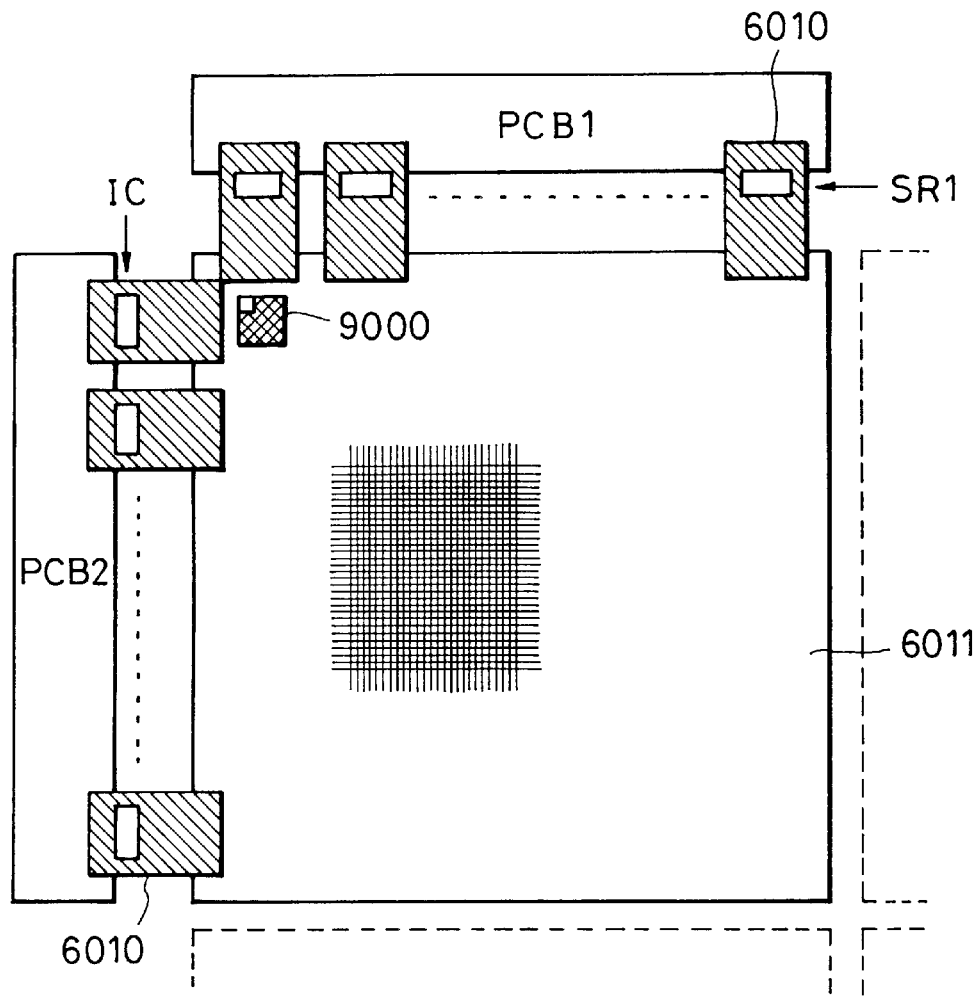
FIGS. 18A and 18B form a schematic diagram illustrating another embodiment of a photoelectric conversion apparatus according to the present invention, wherein its plan view and cross-sectional view are shown in FIGS. 18A and 18B, respectively.
Figure 18B:
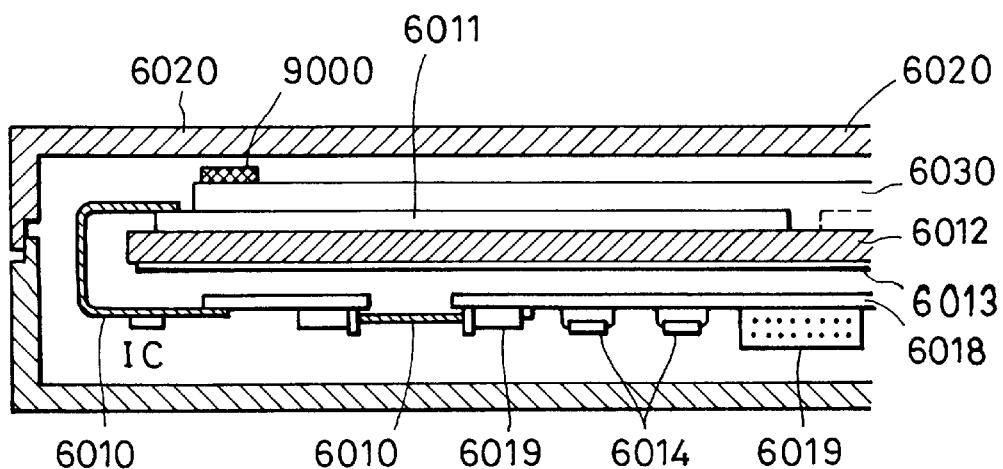

FIGS. 18A and 18B are a plan view and a cross-sectional view, respectively, schematically representing another example of a photoelectric conversion apparatus for detecting an X-ray, according to the present invention.

In FIG. 18, a plurality of sets of a photoelectric conversion element and a TFT are formed on a sensor substrate 6011. Flexible circuit boards 6010 on which a shift register SR1 or a detection integrated circuit is mounted are connected to the sensor substrate 6011. The other end of each flexible circuit board 6010 is connected to a circuit board PCB1 or PCB2. A plurality of sensor substrates 6011 are bonded to a base substrate 6012 so that they are mounted thereon. On the back surface of the base substrate 6012 making up a large-sized photoelectric conversion apparatus, there is provided a lead plate 6013 for protecting a memory 6014 in a processing circuit 6018 from irradiation of an X-ray. On the sensor substrate 6011, as in the fifth embodiment, there is provided a phosphor 6030 (such as a CsI) serving as a wavelength converter for converting an X-ray to visible light wherein the phosphor 6030 is disposed on the sensor substrate 6011 using an adhesive or by means of coating. In the present embodiment, as shown in FIG. 18B, the entire apparatus is enclosed in a case 6020 made of carbon fiber.

In this embodiment, a lead plate 9000 serving as a shielding member for blocking or substantially blocking an X-ray is disposed on the phosphor 6030 so that no X-ray is incident on the phosphor 6030. The photoelectric conversion element located under the lead plate 9000 is illuminated by no or substantially no light from the phosphor. Therefore, it is possible to make offset correction on the basis of the output signal of this photoelectric conversion element.

Sixth Embodiment

Figure 19A:
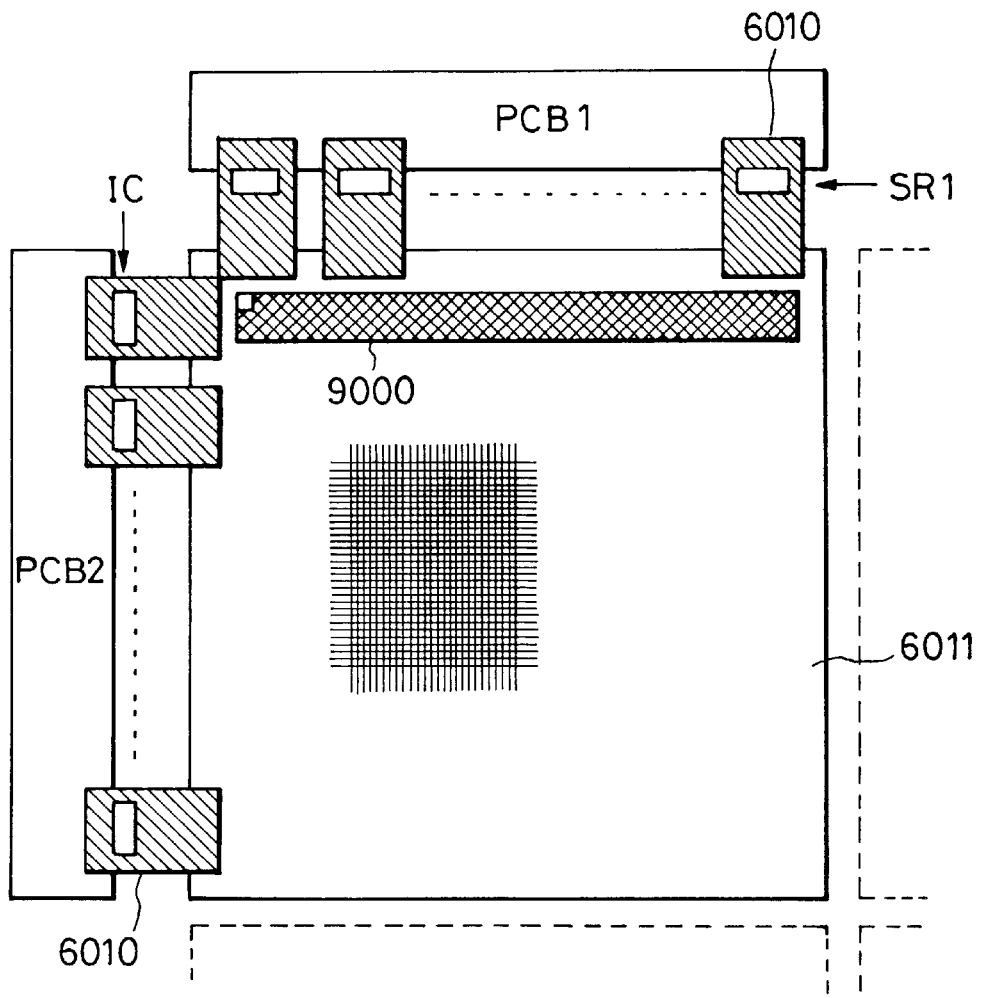
FIGS. 19A and 19B together form a schematic diagram illustrating still another embodiment of a photoelectric conversion apparatus according to the present invention, wherein its plan view and cross-sectional view are shown in FIGS. 19A and 19B, respectively.
Figure 19B:
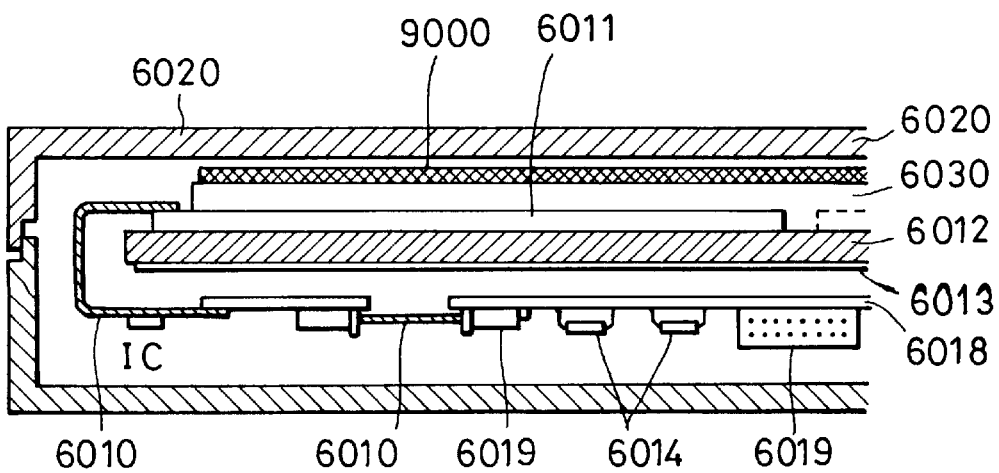

FIGS. 19A and 19B are a plan view and a cross-sectional view, respectively, schematically representing another example of a photoelectric conversion apparatus for detecting an X-ray, according to the present invention.

This sixth embodiment is similar to the fifth embodiment except that a lead plate 9000 serving as a shielding member is disposed on one line of photoelectric conversion elements on the side where there are connections to shift registers SR1.

In this embodiment, offset correction can be made for each line connected to the respective shift registers SR1. Therefore, even if the offset varies from line to line, the offset can be compensated for. This makes it possible to achieve more uniform output characteristics.

Seventh Embodiment

Figure 20A:
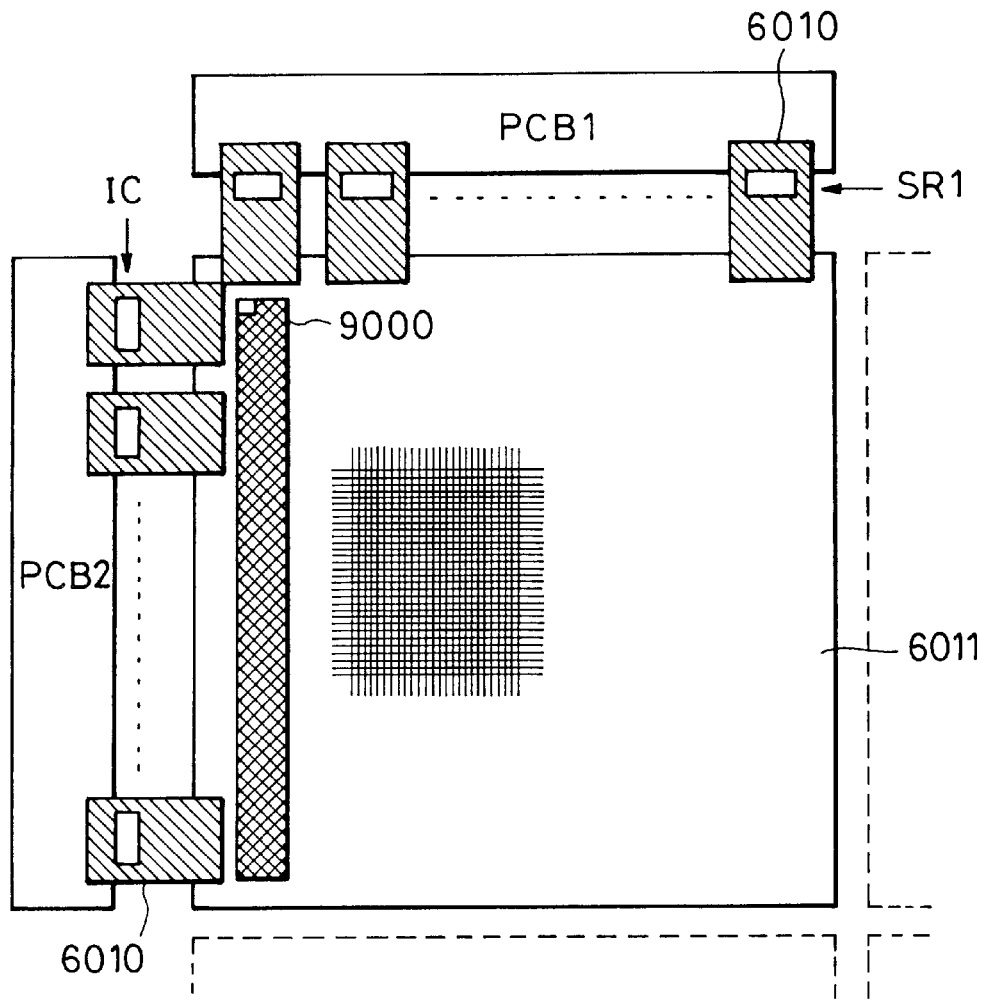
FIGS. 20A and 20B together form a schematic diagram illustrating still another embodiment of a photoelectric conversion apparatus according to the present invention, wherein its plan view and cross-sectional view are shown in FIGS. 20A and 20B, respectively.
Figure 20B:
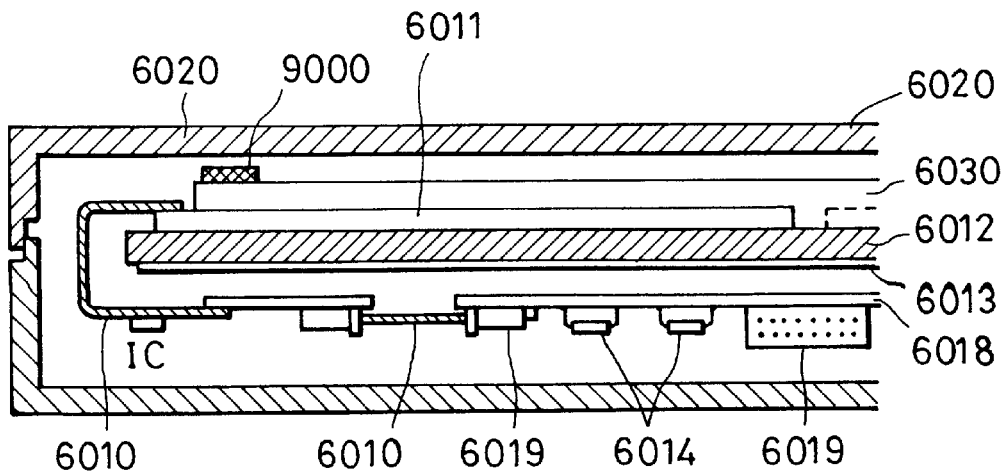

FIGS. 20A and 20B are a plan view and a cross-sectional view, respectively, schematically representing another example of a photoelectric conversion apparatus for detecting an X-ray, according to the present invention.

This embodiment is similar to the sixth embodiment except that a lead plate 9000 serving as a shielding member is disposed on one line of photoelectric conversion elements not on the side where there are connections to shift registers SR1 but on the side where there are connections to detection integrated circuits.

In this embodiment, offset correction can be made for each output line. Therefore, it is possible to more easily adjust he output characteristics.

In addition to the lead plate used in this embodiment, another lead plate serving as a shielding member may be disposed along the shift registers SR1 as in the sixth embodiment.

In the sixth and seventh embodiment, the shielding member may be disposed on the phosphor 6030 on its side which is in direct contact with the photoelectric conversion elements so that light is blocked at a location nearer to the photoelectric conversion elements thereby suppressing diffracted or scattered light striking the photoelectric conversion elements. In the case where the shielding member is disposed on the phosphor, it becomes easy to form the phosphor. In this case, there is another advantage that the phosphor itself generates no light (no wavelength conversion occurs).

In the case where the shielding member is disposed between the phosphor and the photoelectric conversion elements, what is required for the shielding member is to block the light from the phosphor. This means that the color of the shielding member is not limited to black. Another color of shielding member may also be employed as long as the color includes a high enough strength of color component complementary to the color of the light generated by the phosphor. For example, when the phosphor generates light with green color, a filter with a high enough strength of red may be employed.

That is, even if an X-ray passes through the shielding member, the role of the shielding member is achieved if the phosphor emits no or substantially no light or if the emitted light cannot or substantially cannot be detected by the photoelectric conversion elements. In the case where the shielding member is disposed in such a manner as to block the light emitted by the phosphor, the role of the shielding member is achieved if the emitted light cannot or substantially cannot be detected by the photoelectric conversion elements.

Alternatively, a shielding member such as a lead plate may be disposed on a proper photoelectric conversion element without forming a phosphor on that photoelectric conversion element.

Figure 21:
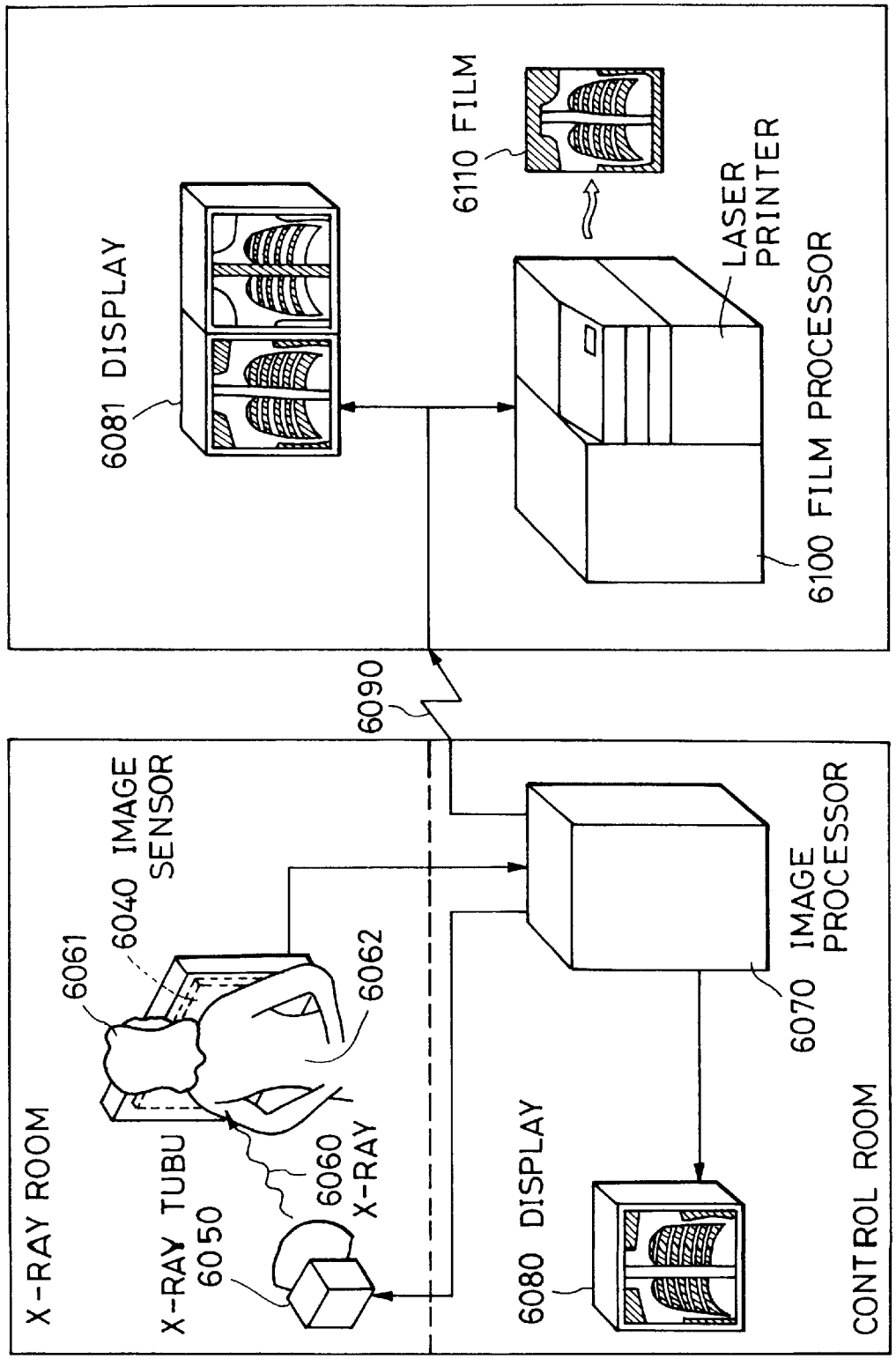
FIG. 21 is a schematic diagram illustrating an example of an X-ray diagnostic (test) system including a photoelectric conversion apparatus according to the present invention.

FIG. 21 illustrates an example of a system in which a photoelectric conversion apparatus according to the present invention is applied to an X-ray diagnostic system.

In FIG. 21, an X-ray 6060 is generated by an X-ray tube 6050, and is passed through a chest 6062 of a patient or a subject 6061 under examination. After passing through the chest 6062, the X-ray is incident on a photoelectric conversion apparatus 6040 having a phosphor mounted on its upper side. The incident X-ray includes information about the inner structure of the subject 6061. In response to the incident X-ray, the phosphor emits light, which is converted to corresponding electric information. After the electric information is converted into a digital form, it is subjected to image processing with an image processor 6070, and displayed on a display device 6080. Thus, it is possible to inspect the subject nondestructively.

The information may be transmitted to a remote location via transmission means such as a telephone line 6090 so that the information is displayed on a display device 6081 at a different location or it is stored in storage means such as a magneto-optical disk. The information may also be recorded on a film 6110 via a film processor 6100.

In the case where four sensor substrates are mounted on a single base substrate to form an X-ray diagnostic system as in this embodiment, one or more photoelectric conversion elements which are no very important such as those located in any corner or on any side or in all four corners or on at least two sides of the substrate may be employed as a correction photoelectric conversion element(s) used to correct the outputs of the photoelectric conversion elements. With this construction, no additional special scanning time is needed to obtain outputs for use in correction. Furthermore, by disposing at least one correction photoelectric conversion element on each sensor substrate, the offset and sensitivity levels may be adjusted relative to one another.

Preferably, the photoelectric conversion elements in the corners of the photoelectric conversion apparatus are employed as correction photoelectric conversion elements, because they are not very important. When four panels are mounted on a single base, if a shielding member such as a filter is disposed in one corner of each panel, it becomes possible to correct the variations among four panels.

Furthermore, if a 0%-filet 7000 and a 50%-filter 8000 are formed into such a shape as shown in FIG. 17, the influences of reflection of incident light and leakage of light may be minimized.

The photoelectric conversion apparatus according to the present invention has the following advantages.

In the photoelectric conversion apparatus including a plurality of two-dimensionally arranged photoelectric conversion elements whose output signals are sequentially read by scanning the driving lines in the X direction line by line thereby transferring the signal charges via the signal lines in the Y direction, a filter whose light transmittance is substantially zero or a lead plate whose X-ray transmittance is substantially zero is disposed on an arbitrary photoelectric conversion element and this photoelectric conversion element is used as a photoelectric conversion element for use in correcting the offset of the output signals. This makes it unnecessary to additionally form a special photoelectric conversion element for use in correction.

Therefore, no connection circuit for connecting an external photoelectric conversion element for use in correction is needed and no process of making such a connection is necessary. This allows an improvement in production yield and a reduction in cost.

In the photoelectric conversion apparatus, a filter whose light transmittance m is between 0 and 100% may be disposed on an arbitrary photoelectric conversion element, and this photoelectric conversion element may be used as a photoelectric conversion element for use in correcting the sensitivity of the photoelectric conversion elements without having to additionally form a special photoelectric conversion element for use in correction.

By using these photoelectric conversion elements for use in correction, it is also possible to compensate for the variation in the light sensitivity of the photoelectric conversion elements and the variation in the output level obtained when the photoelectric conversion elements are illuminated by no light, that is, the variation in the offset level.

Unlike the case where a separate correction circuit is provided on a photoelectric conversion apparatus, the photoelectric conversion apparatus according to the present invention can be realized with a simple circuit thus causing neither a reduction in production yield nor an increase in cost.

In the photoelectric conversion apparatus according to the present invention, since some proper one or ones of two-dimensionally arranged photoelectric conversion elements are used as correction photoelectric conversion elements, no additional time is required to read correction output signals unlike the case where correction photoelectric conversion elements are separately provided. This makes it possible to correct the output levels of the photoelectric conversion elements in a short time, thus making it possible to easily obtain a moving picture.

When a plurality of (for example four) sensor substrates are mounted on a single base substrate so as to obtain an X-ray diagnostic system, a photoelectric conversion element at a location which is not very important, such as a corner or a side of the base substrate, is employed as a correction photoelectric element for use in correcting the output levels of the photoelectric conversion elements. With this structure, no additional time for scanning the output signals is required.

If at least one photoelectric conversion element for use in correction is provided on each sensor substrate, it becomes possible to compensate for the variations in the offset level and/or sensitivity among the sensor substrates.

Although the present invention has been described above with reference particular embodiments, it is not intended to be limited to the details shown, since various modifications and changes may be made without departing from the spirit and scope of the present invention.

What is claimed is:

1. A photoelectric conversion apparatus comprising:
   a plurality of photoelectric conversion elements two-dimensionally arranged on a substrate;
   a wavelength converter arranged at an image information input side of said plurality of photoelectric conversion elements; and
   a shielding member with a transmittance of 0% or substantially 0% to an X-ray or light disposed between an arbitrary photoelectric conversion element among said plurality of photoelectric conversion elements and said wavelength converter.

2. A photoelectric conversion apparatus according to claim 1, wherein said shielding member includes a filter.

3. A photoelectric conversion apparatus according to claim 2, wherein said filter has a color component complementary to the color of light incident on said filter.

4. A photoelectric conversion apparatus according to claim 1, further including a second shielding member having a transmittance m to light satisfying the condition 0<m<100%.

5. A photoelectric conversion apparatus according to claim 1, wherein said photoelectric conversion element corresponding to said shielding member is a photoelectric conversion element for correction.

6. A photoelectric conversion apparatus according to claim 4, wherein said photoelectric conversion element corresponding to said second shielding member is a photoelectric conversion element for sensitivity correction.

7. A photoelectric conversion apparatus according to claim 1, wherein said shielding member is disposed at a location corresponding to a photoelectric conversion element located in a corner of said photoelectric conversion part.

8. A photoelectric conversion apparatus according to claim 1, wherein said shielding member is disposed at a location corresponding to a line of photoelectric conversion elements.

9. A photoelectric conversion apparatus according to claim 8, wherein said line of photoelectric conversion elements includes a line at an end of said photoelectric conversion part.

10. A photoelectric conversion apparatus according to claim 1, wherein said photoelectric conversion part comprises a plurality of substrates disposed in close proximity to one another.

11. A photoelectric conversion apparatus according to claim 10, wherein each said substrate has its own shielding member.

12. A photoelectric conversion apparatus according to claim 1, wherein said wavelength converter includes a phosphor.

13. A photoelectric conversion apparatus according to claim 1, wherein said shielding member includes lead.

14. A photoelectric conversion apparatus according to claim 5, wherein said photoelectric conversion element for correction is used to made an offset correction.

15. A photoelectric conversion apparatus according to claim 1, wherein each said photoelectric conversion element comprises:
- a first electrode layer;
- a first insulating layer acting as a barrier for preventing both first-type carriers and second-type carriers opposite in polarity to said first-type carriers from passing through said insulating layer;
- a photoelectric conversion semiconductor layer made of a non-single crystal semiconductor;
- a second electrode layer; and
- an injection barrier for preventing said first-type carriers from being injected into said photoelectric conversion semiconductor layer, said injection barrier being located between said second electrode layer and said photoelectric conversion semiconductor layer.

16. A photoelectric conversion apparatus according to claim 1, further including a switching element for driving said photoelectric conversion semiconductor layer.

17. A photoelectric conversion apparatus according to claim 16, wherein said switching element is disposed for each said photoelectric conversion element.

18. A photoelectric conversion apparatus according to claim 16, wherein said switching element includes a thin film transistor.

19. A photoelectric conversion apparatus according to claim 15, further including:
- a control part for controlling said switching element in such a manner that in a refreshing mode, an electric field is applied across the respective layers of said photoelectric conversion elements in a direction in which said first-type carriers are directed from said photoelectric conversion semiconductor layer to said second electrode layer, and in a photoelectric conversion mode an electric field is applied across the respective layers of said photoelectric conversion elements in a direction in which said first-type carriers generated by light incident on said photoelectric conversion semiconductor layer remain within said photoelectric conversion semiconductor layer and said second-type carriers are directed to said second electrode layer so that said first-type carriers accumulated in said photoelectric conversion semiconductor layer or said second-type carriers directed to said second electrode layer in said photoelectric conversion mode are detected as an optical signal;
- a power supply; and
- a detecting part for performing said detection.

20. A photoelectric conversion apparatus according to claim 16, wherein said switching element includes: a gate electrode layer; a second insulating layer; a non-single crystal semiconductor layer; a pair of first and second main electrode layers spaced by a channel region formed in said semiconductor layer; and ohmic contact layers disposed between said main electrode layers and said semiconductor layer.

21. A photoelectric conversion apparatus according to claim 15, further including switching elements corresponding to the respective photoelectric conversion elements, each said switching element including: a gate electrode layer; a second insulating layer; a semiconductor layer; a pair of main electrode layers formed on said semiconductor layer via an ohmic contact layer, said main electrode layers being spaced from each other, wherein in said photoelectric conversion elements and said switching elements, said first electrode layer and said gate electrode layer, said first insulating layer and said second insulating layer, said photoelectric conversion semiconductor layer and said semiconductor layer, said second electrode layer and said main electrode layer, and said injection barrier layer and said ohmic contact layer are formed with corresponding common layers, respectively.

22. A photoelectric conversion apparatus according to claim 1, wherein said wavelength converter comprises a function of converting the wavelength of image information inputted to a wavelength range which can be detected by photoelectric conversion elements.

23. A photoelectric conversion apparatus according to claim 1, wherein said wavelength converter comprises CsI.

24. A photoelectric conversion apparatus according to claim 4, wherein a transmittance of a second shielding member to an X-ray or light is 50%.

25. A photoelectric conversion apparatus comprising:
- a plurality of photoelectric conversion elements arranged two-dimensionally on a substrate;
- a wavelength converter arranged at the image information input side of said plurality of photoelectric conversion elements; and
- a shielding member with a transmittance of 0% or substantially 0% to an X-ray or light disposed at the image information input side of said wavelength converter corresponding to an arbitrary photoelectric conversion element among said photoelectric conversion elements.

26. A photoelectric conversion apparatus according to claim 25, wherein said shielding member includes a filter.

27. A photoelectric conversion apparatus according to claim 26, wherein said filter has a color component complementary to the color of light incident on said filter.

28. A photoelectric conversion apparatus according to claim 25, further including a second shielding member having a transmittance m to light satisfying the condition $0<m<100\%$.

29. A photoelectric conversion apparatus according to claim 25, wherein said photoelectric conversion element corresponding to said shielding member is a photoelectric conversion element for correction.

30. A photoelectric conversion apparatus according to claim 28, wherein said photoelectric conversion element corresponding to said second shielding member is a photoelectric conversion element for sensitivity correction.

31. A photoelectric conversion apparatus according to claim 25, wherein said shielding member is disposed at a location corresponding to a photoelectric conversion element located in a corner of said photoelectric conversion part.

32. A photoelectric conversion apparatus according to claim 25, wherein said shielding member is disposed at a location corresponding to a line of photoelectric conversion elements.

33. A photoelectric conversion apparatus according to claim 32, wherein said line of photoelectric conversion elements includes a line at an end of said photoelectric conversion part.

34. A photoelectric conversion apparatus according to claim 25, wherein said photoelectric conversion part comprises a plurality of substrates disposed in close proximity to one another.

35. A photoelectric conversion apparatus according to claim 34, wherein each said substrate has its own shielding member.

36. A photoelectric conversion apparatus according to claim 25, wherein said wavelength converter includes a phosphor.

37. A photoelectric conversion apparatus according to claim 25, wherein said shielding member includes lead.

38. A photoelectric conversion apparatus according to claim 29, wherein said photoelectric conversion element for correction is used to made an offset correction.

39. A photoelectric conversion apparatus according to claim 25, wherein each said photoelectric conversion element comprises:
   a first electrode layer;
   a first insulating layer acting as a barrier for preventing both first-type carriers and second-type carriers opposite in polarity to said first-type carriers from passing through said insulating layer;
   a photoelectric conversion semiconductor layer made of a non-single crystal semiconductor;
   a second electrode layer; and
   an injection barrier for preventing said first-type carriers from being injected into said photoelectric conversion semiconductor layer, said injection barrier being located between said second electrode layer and said photoelectric conversion semiconductor layer.

40. A photoelectric conversion apparatus according to claim 25, further including a switching element for driving said photoelectric conversion semiconductor layer.

41. A photoelectric conversion apparatus according to claim 40, wherein said switching element is disposed for each said photoelectric conversion element.

42. A photoelectric conversion apparatus according to claim 40, wherein said switching element includes a thin film transistor.

43. A photoelectric conversion apparatus according to claim 39, further including:
   a control part for controlling said switching element in such a manner that in a refreshing mode, an electric field is applied across the respective layers of said photoelectric conversion elements in a direction in which said first-type carriers are directed from said photoelectric conversion semiconductor layer to said second electrode layer, and in a photoelectric conversion mode an electric field is applied across the respective layers of said photoelectric conversion elements in a direction in which said first-type carriers generated by light incident on said photoelectric conversion semiconductor layer remain within said photoelectric conversion semiconductor layer and said second-type carriers are directed to said second electrode layer so that said first-type carriers accumulated in said photoelectric conversion semiconductor layer or said second-type carriers directed to said second electrode layer in said photoelectric conversion mode are detected as an optical signal;
   a power supply; and
   a detecting part for performing said detection.

44. A photoelectric conversion apparatus according to claim 40, wherein said switching element includes: a gate electrode layer; a second insulating layer; a non-single crystal semiconductor layer; a pair of first and second main electrode layers spaced by a channel region formed in said semiconductor layer; and ohmic contact layers disposed between said main electrode layers and said semiconductor layer.

45. A photoelectric conversion apparatus according to claim 39, further including switching elements corresponding to the respective photoelectric conversion elements, each said switching element including: a gate electrode layer; a second insulating layer; a semiconductor layer; a pair of main electrode layers formed on said semiconductor layer via an ohmic contact layer, said main electrode layers being spaced from each other, wherein in said photoelectric conversion elements and said switching elements, said first electrode layer and said gate electrode layer, said first insulating layer and said second insulating layer, said photoelectric conversion semiconductor layer and said semiconductor layer, said second electrode layer and said main electrode layer, and said injection barrier layer and said ohmic contact layer are formed with corresponding common layers, respectively.

46. A photoelectric conversion apparatus according to claim 25, wherein said wavelength converter comprises a function of converting the wavelength of image information inputted to a wavelength range which can be detected by photoelectric conversion elements.

47. A photoelectric conversion apparatus according to claim 25, wherein said wavelength converter comprises CsI.

48. A photoelectric conversion apparatus according to claim 28, wherein a transmittance of a second shielding member to an X-ray or light is 50%.

49. A photoelectric conversion apparatus according to claim 1, further comprising a case for enclosing the substrate, a plurality of photoelectric conversion elements, said wavelength converter, and said shielding member.

50. A photoelectric conversion apparatus according to claim 49, wherein the case is made of carbon fiber.

51. A photoelectric conversion apparatus according to claim 25, further comprising a case for enclosing the substrate, a plurality of photoelectric conversion elements, said wavelength converter, and said shielding member.

52. A photoelectric conversion apparatus according to claim 51, wherein the case is made of carbon fiber.

53. An image processing system comprising:
   a plurality of photoelectric conversion elements arranged two-dimensionally on a substrate;
   a wavelength converter arranged at an image information input side of said plurality of photoelectric conversion elements;
   a shielding member with a transmittance of 0% or substantially 0% to an X-ray or light disposed between an arbitrary photoelectric conversion element among said plurality of photoelectric conversion elements and said wavelength converter; and
   an image processing means for processing an image by amending the output from the said photoelectric conversion elements not corresponding to said shielding member on the basis of the output from the said arbitrary photoelectric conversion element corresponding to said shielding member.

54. An image processing system according to claim 53, wherein said wavelength converter converts the X-ray to light with a wavelength which can be detected by photoelectric conversion elements.

55. An image processing system comprising:

a plurality of photoelectric conversion elements arranged two-dimensionally on a substrate;

a wavelength converter arranged at the image information input side of said plurality of photoelectric conversion elements;

a shielding member with a transmittance 0% or substantially 0% to an X-ray or light disposed at the image information input side of said wavelength converter corresponding to an arbitrary photoelectric conversion element among said plurality of photoelectric conversion elements; and an image processing means for processing an image by amending the output from said photoelectric conversion elements not corresponding to said shielding member on the basis of the output from said arbitrary photoelectric conversion element corresponding to said shielding member.

56. An image processing system according to claim 53, wherein said wavelength converter converts the X-ray to light with a wavelength which can be detected by photoelectric conversion elements.

* * * * *

UNITED STATES PATENT AND TRADEMARK OFFICE
CERTIFICATE OF CORRECTION

PATENT NO.   : 6,034,406
DATED        : March 7, 2000
INVENTOR(S)  : Isao Kobayashi et al.

It is certified that error appears in the above-identified patent and that said Letters Patent is hereby corrected as shown below:

Drawings,
Sheet 19 of 19, FIG. 21, "X-RAY TUBU" should read -- X-RAY TUBE --.

Column 1,
Line 24, "refers" should read -- referred --;
Line 26, "the" should be deleted; and
Line 47, "of" should be deleted.

Column 4,
Line 35, "very" (first occurrence) should read -- a very --; and
Line 46, "of" should read -- of a --.

Column 7,
Line 24, "Photocurrents" should read -- photocurrents --; and
Line 60, "the number" should read -- number --.

Column 8,
Line 13, "apparatus" should read -- apparatuses --;
Line 22, "the" (both occurrences) should be deleted; and
Line 24, "decreases" should read -- decrease --, Column 9,
Line 53, "well matches" should read -- matches well --.

Column 10,
Line 53, "together" should read -- together form --.

Column 13,
Line 54, "outputs" should read -- output --.

Column 16,
Line 5, "he" should read -- the --; and
Line 26, "shielding" should read -- the shielding --.

UNITED STATES PATENT AND TRADEMARK OFFICE
CERTIFICATE OF CORRECTION

PATENT NO. : 6,034,406
DATED : March 7, 2000
INVENTOR(S) : Isao Kobayashi et al.

It is certified that error appears in the above-identified patent and that said Letters Patent is hereby corrected as shown below:

Column 17,
Line 4, "no" should read -- not --; and
Line 22, "0%-filet 7000" should read -- 0% filter 7000 --.

Column 18,
Line 22, "reference" should read -- reference to --.

Column 19,
Line 15, "made" should read -- make --.

Column 21,
Line 19, "made" should read -- make --.

Signed and Sealed this

Eighteenth Day of June, 2002

Attest:

Attesting Officer

JAMES E. ROGAN
Director of the United States Patent and Trademark Office